United States Patent
Rebstock

(10) Patent No.: US 10,065,222 B2
(45) Date of Patent: Sep. 4, 2018

(54) CLEANING SYSTEMS AND METHODS FOR SEMICONDUCTOR SUBSTRATE STORAGE ARTICLES

(71) Applicant: BROOKS AUTOMATION (GERMANY) GmbH, Jena (DE)

(72) Inventor: Lutz Rebstock, Gaienhofen (DE)

(73) Assignee: Brooks Automation (Germany) GmbH, Ernst-Ruska-Ring Jena (DE)

( * ) Notice: Subject to any disclaimer, the term of this patent is extended or adjusted under 35 U.S.C. 154(b) by 0 days.

(21) Appl. No.: 15/031,334

(22) PCT Filed: Oct. 20, 2014

(86) PCT No.: PCT/IB2014/065458
§ 371 (c)(1),
(2) Date: Apr. 22, 2016

(87) PCT Pub. No.: WO2015/059615
PCT Pub. Date: Apr. 30, 2015

(65) Prior Publication Data
US 2016/0271658 A1 Sep. 22, 2016

Related U.S. Application Data

(60) Provisional application No. 61/894,883, filed on Oct. 23, 2013.

(51) Int. Cl.
*B08B 9/093* (2006.01)
*B08B 9/34* (2006.01)
(Continued)

(52) U.S. Cl.
CPC .............. *B08B 9/34* (2013.01); *B08B 3/08* (2013.01); *B08B 3/10* (2013.01); *B08B 3/12* (2013.01);
(Continued)

(58) Field of Classification Search
CPC ........... B08B 9/0821; B08B 5/02; B08B 3/08; B08B 3/12; B08B 3/10; B08B 9/34;
(Continued)

(56) References Cited

U.S. PATENT DOCUMENTS

| 4,571,850 A | 2/1986 | Hunt et al. |
| 6,248,177 B1 * | 6/2001 | Halbmaier ................ B08B 3/02 |
| | | 134/2 |

(Continued)

FOREIGN PATENT DOCUMENTS

| CN | 102804332 | 11/2012 |
| CN | 103170469 | 6/2013 |

OTHER PUBLICATIONS

International Search Report, International Application No. PCT/IB2014/065458, dated Feb. 4, 2015.

(Continued)

*Primary Examiner* — Binh X Tran
*Assistant Examiner* — David Cathey, Jr.
(74) *Attorney, Agent, or Firm* — Perman & Green, LLP; Colin Durham

(57) ABSTRACT

Provided are methods and systems for cleaning various semiconductor substrate storage articles, in particular, FOUP doors. The FOUP doors and other similar articles often have openings that may get contaminated with cleaning liquids if not covered. The described cleaning system includes contact points for engaging the article and covering these openings. The contact points may be also used for supporting the article and for pressurizing the openings in the article with a gas. The gas may be supplied through one or more contact points. It prevents liquids from getting into the openings if even the openings are not completely sealed. The pressurization may be maintained through the entire wet portion of the cleaning process. The article may be rotated (Continued)

within the cleaning system while cleaning and/or other liquids or gases are dispensed through a set of spraying nozzles. Spraying nozzles may move to enhance cleaning of the article.

6 Claims, 25 Drawing Sheets

(51) Int. Cl.
| | |
|---|---|
| *H01L 21/67* | (2006.01) |
| *B08B 3/08* | (2006.01) |
| *B08B 3/10* | (2006.01) |
| *B08B 3/12* | (2006.01) |
| *B08B 5/02* | (2006.01) |
| *B08B 9/08* | (2006.01) |
| *H01L 21/673* | (2006.01) |
| *B08B 9/28* | (2006.01) |

(52) U.S. Cl.
CPC .............. *B08B 5/02* (2013.01); *B08B 9/0821* (2013.01); *B08B 9/283* (2013.01); *H01L 21/67028* (2013.01); *H01L 21/67051* (2013.01); *H01L 21/67389* (2013.01)

(58) Field of Classification Search
CPC ............... B08B 9/283; H01L 21/67389; H01L 21/67028; H01L 21/67051
See application file for complete search history.

(56) References Cited

U.S. PATENT DOCUMENTS

| | | | |
|---|---|---|---|
| 2002/0104533 A1* | 8/2002 | Kalhok .................. | A42B 3/226 128/201.24 |
| 2004/0084066 A1 | 5/2004 | Dolechek et al. | |
| 2006/0033222 A1* | 2/2006 | Godfrey .............. | B01F 3/04262 261/122.1 |
| 2010/0319730 A1 | 12/2010 | Rebstock | |
| 2013/0074882 A1* | 3/2013 | Ackermann .......... | A62B 25/00 134/36 |

OTHER PUBLICATIONS

Chinese Search Report, Chinese Application No. 2014800587424X, dated Feb. 9, 2018.

* cited by examiner

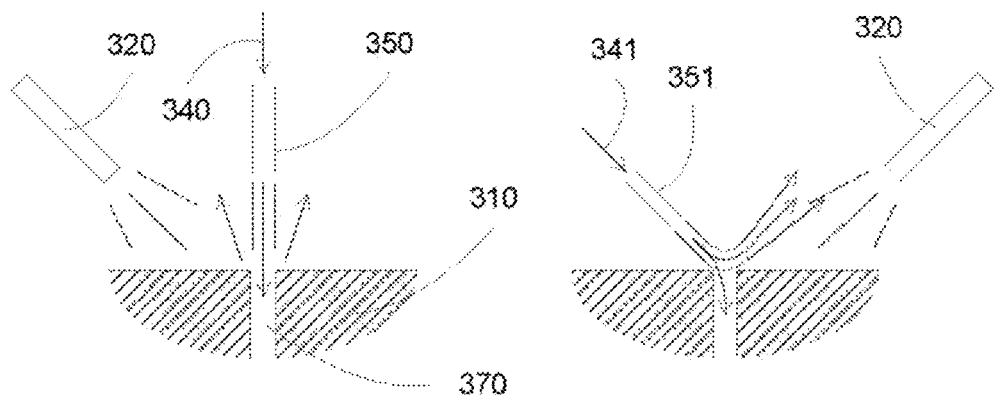
FIG. 3A  FIG. 3B
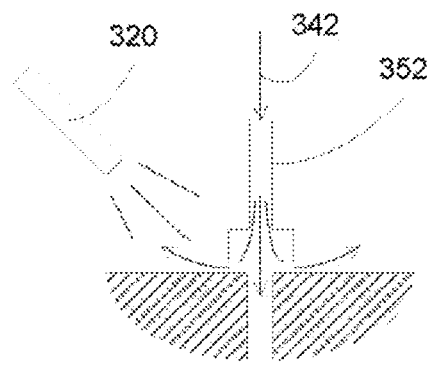 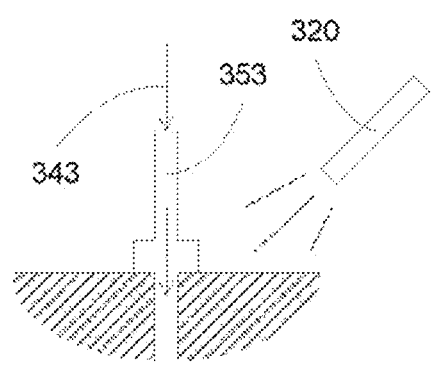
FIG. 3C  FIG. 3D
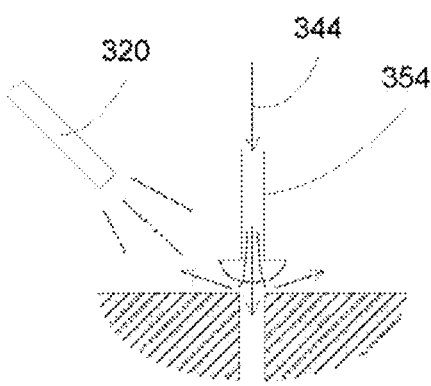 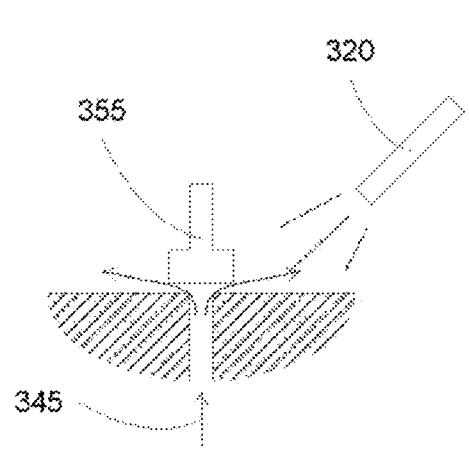
FIG. 3E  FIG. 3F

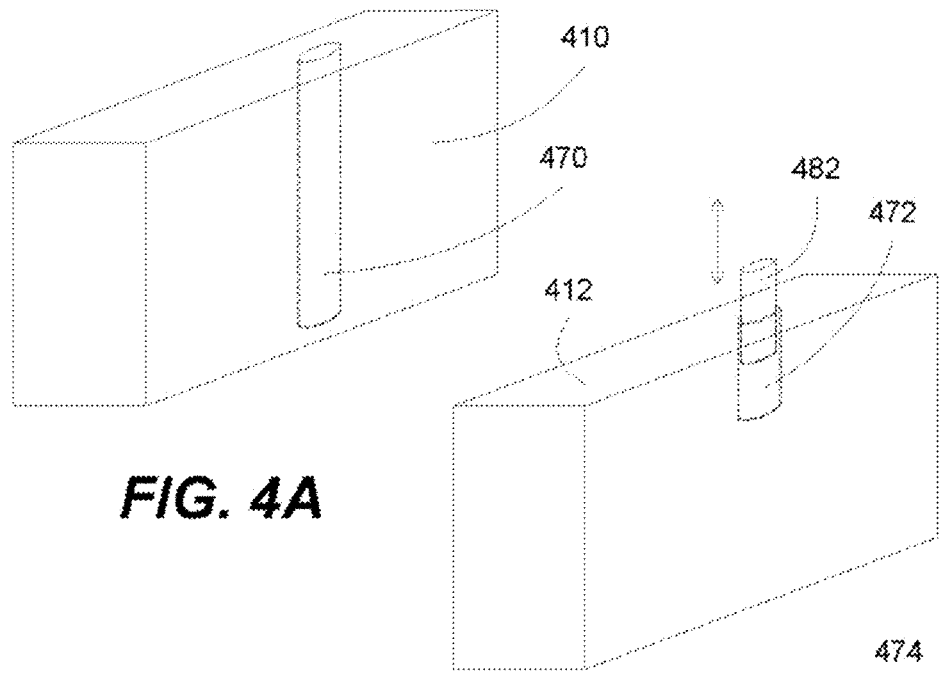
FIG. 4A
FIG. 4B
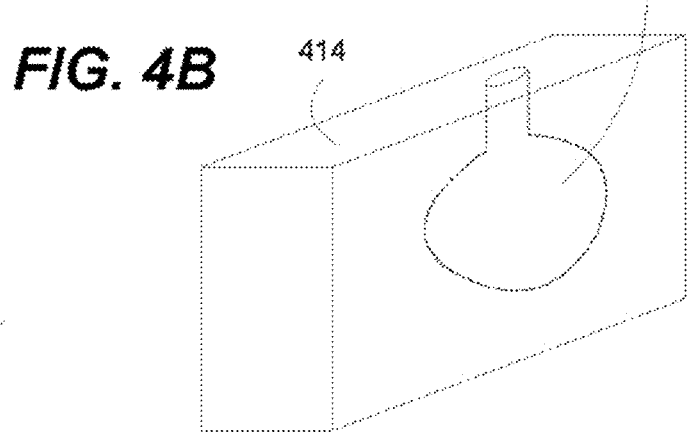
FIG. 4C
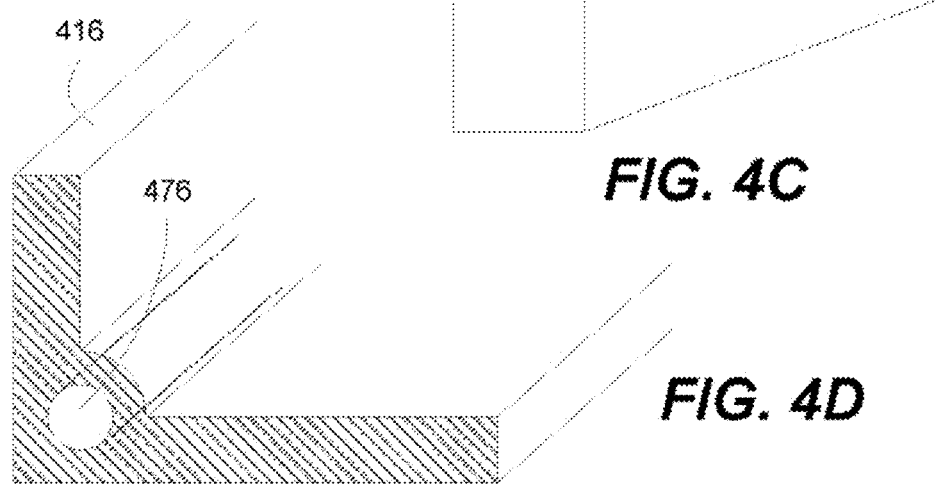
FIG. 4D

Providing an object, wherein the object has a high aspect ratio cavity or gap
500

Flowing a gas in a vicinity of the high aspect ratio cavity to minimize liquid entering the cavity
or
Pressurizing the high aspect ratio cavity with a gas to minimize liquid entering the cavity
or
Blocking the entrance to the high aspect ratio cavity together with flowing a gas to the cavity
or
Partially blocking the entrance to the high aspect ratio cavity together with flowing a gas to the cavity to minimize liquid entering the cavity
510

Flowing a liquid toward the object
or
Cleaning the object with a liquid
520

*FIG. 5*

Providing an object, wherein the object has a high aspect ratio cavity or gap
700

Mounting the object to a rotating mechanism
710

Aligning a gas nozzle with the high aspect ratio cavity,
Wherein the gas nozzle is disposed in a vicinity of the high aspect ratio cavity
or
Wherein the gas nozzle totally or partially blocks the entrance to the high aspect ratio cavity
720

Flowing a gas to the gas nozzle
730

Flowing a liquid toward the object for cleaning
740

Rotating the object
750

*FIG. 7*

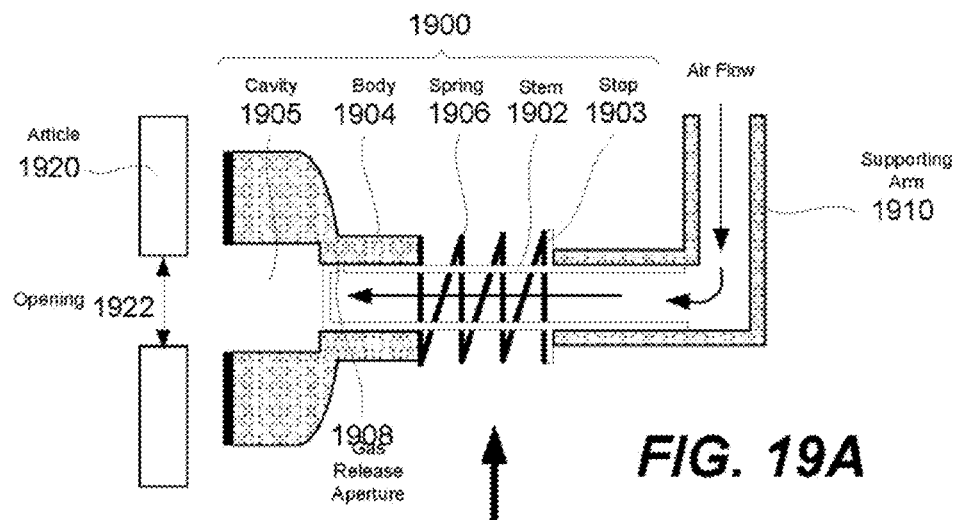
*FIG. 19A*
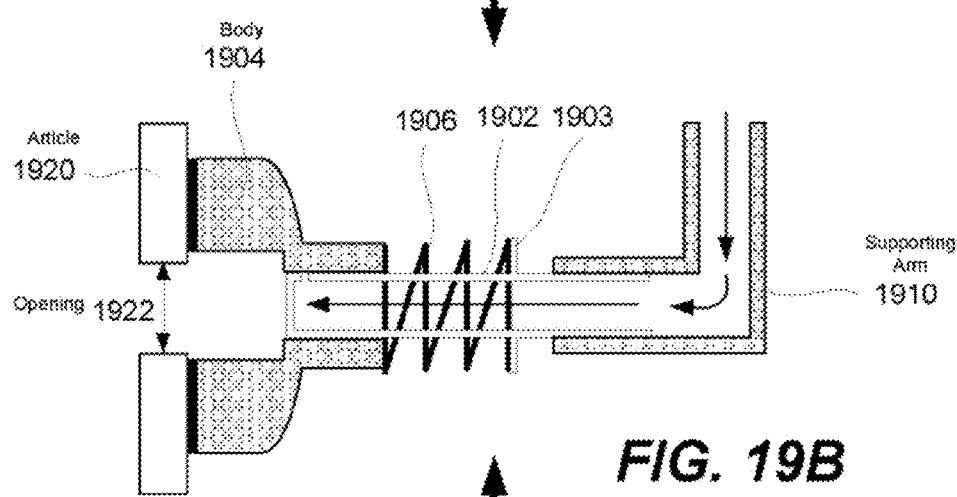
*FIG. 19B*
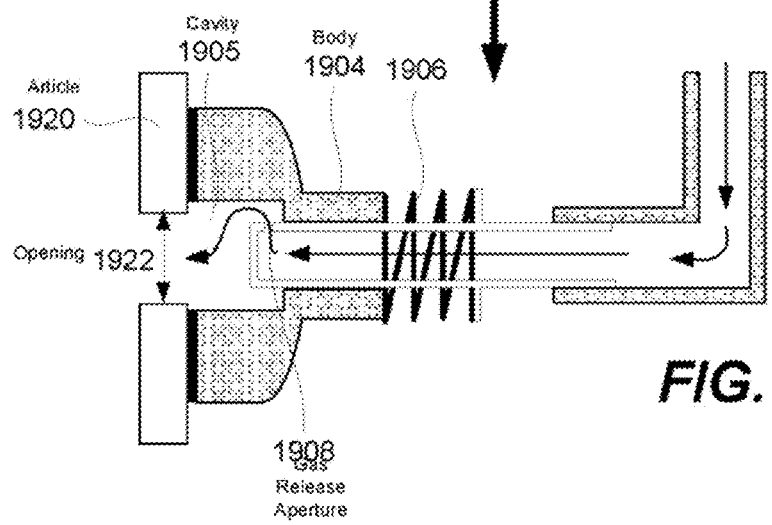
*FIG. 19C*
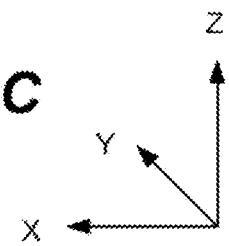

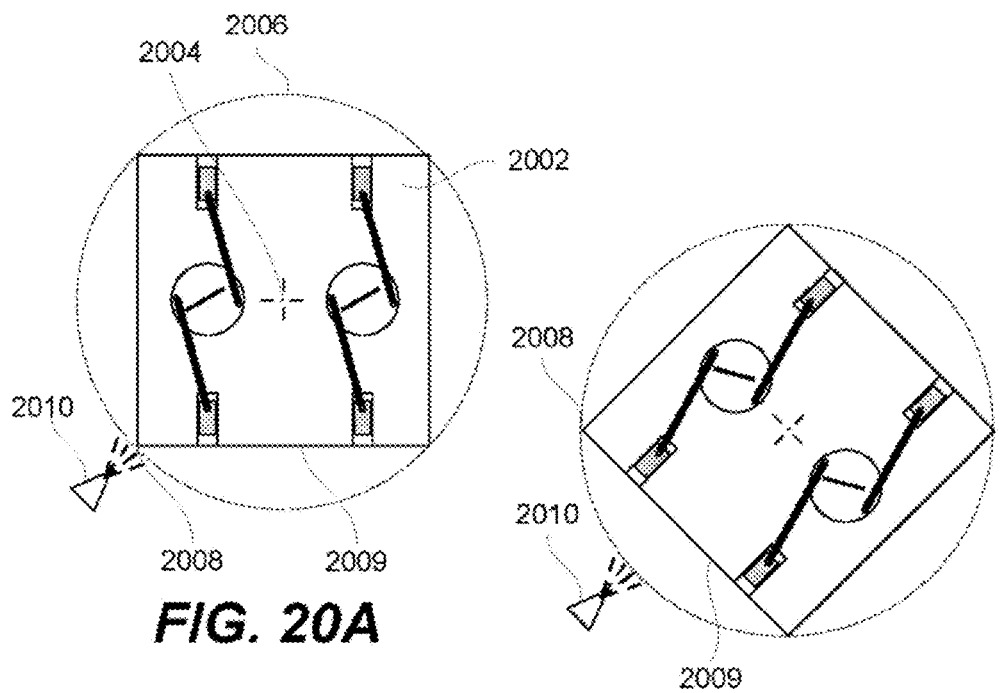
FIG. 20A
FIG. 20B
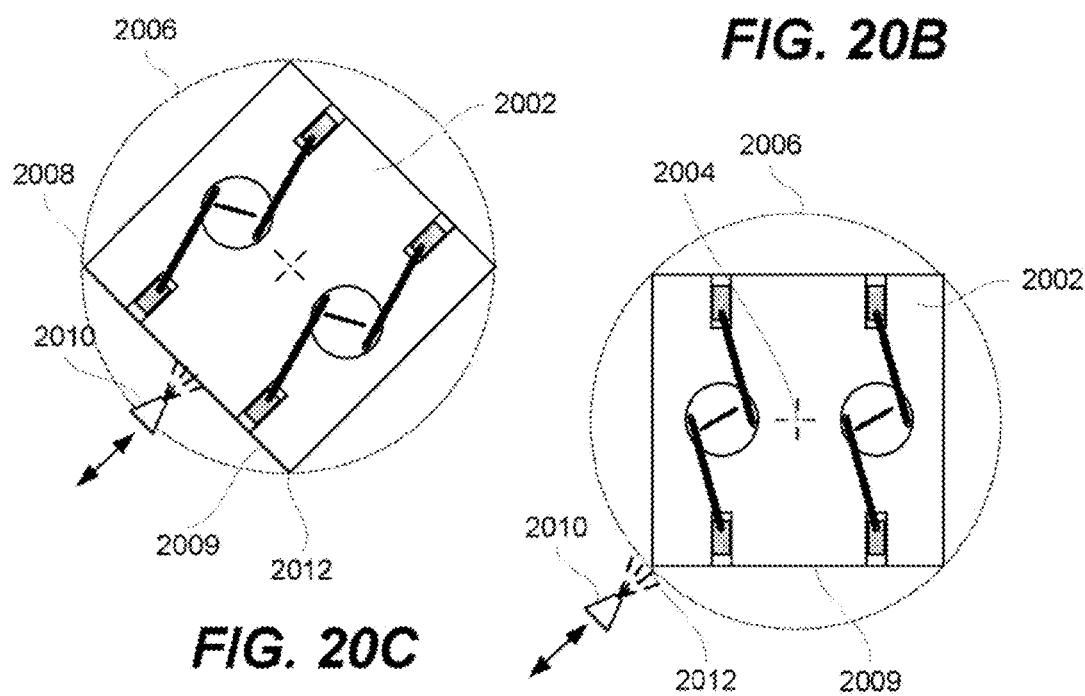
FIG. 20C
FIG. 20D

Loading a body and a lid of a container to a cleaning chamber
2100

Aligning a gas nozzle to a portion of the lid and/or the body, Wherein the gas nozzle is disposed in a vicinity of the portion
or
Wherein the gas nozzle totally or partially blocks the portion
2120

Flowing a gas to the gas nozzle
2130

Flowing a liquid toward the body and lid for cleaning
2140

Rotating the body and lid during cleaning
2150

*FIG. 21*

CLEANING SYSTEMS AND METHODS FOR SEMICONDUCTOR SUBSTRATE STORAGE ARTICLES

CROSS REFERENCE TO RELATED APPLICATIONS

This application is the National State of International Application No. PCT/IB2014/065458, having an International Filing Date of 20 Oct. 2014, which designated the United States of America, and which International Application was published under PCT Article 21(2) as WO Publication No. 2015/059615 A1, and which claims priority from, and the benefit of U.S. Application No. 61/894,883, filed 23 Oct. 2013, the disclosures of which are incorporated herein by reference in their entireties.

This application is related to U.S. application Ser. No. 14/517,900, filed 19 Oct. 2014, which claims priority from, and the benefit of U.S. Application No. 61/894,833 filed 23 Oct. 2013, the disclosures of which are incorporated herein by reference in their entireties.

BACKGROUND

Production of semiconductor devices requires cleanliness of substrates as well as articles used for storing and transferring these substrates. Presence of particulates and other contaminant can negatively impact production yields. The transport of the semiconductor substrates is typically carried out in special articles or, more specifically, containers, such as cassettes, carriers, trays, Front Opening Unified Pod (FOUP), Front-Opening Shipping Box (FOSB), Standard Mechanical Interface (SMIF), MAC (Multi Application Carrier), pods, and boxes. For example, a FOUP typically includes one or more comb-like guiding structures positioned inside a shell for supporting substrates. The FOUP also includes a door that can be removed from the shell and allow a substrate handling robot to access the substrates from the shell.

FOUPs and other articles used for storing and transferring semiconductor substrates need to be periodically cleaned in order to prevent contamination of substrates and to maintain the standard of cleanliness needed for the substrates. The FOUPs and other articles can be cleaned using special cleaning and drying equipment. As the cleanliness requirements become more stringent, the number of cleaning cycles and complexity of each cycle increases. For example, a FOUP may need to be cleaned after each individual use in order to prevent cross contamination.

Overall, it is desirable to shorten the time needed for cleaning FOUPs and other articles used for storing and transferring substrates. At the same time, mechanical complexity of the FOUPs and other articles increases in order to accommodate new substrate handling systems and perform new functions. For example, a FOUP door is engaged with a FOUP body using a complex set of moving parts provided with the FOUP door. Furthermore, FOUP doors and bodies may include numerous openings used for engagement these components and for coupling to these components using, for example, substrate handling equipment. These openings may complicate drying with trapped cleaning and/or other liquids.

SUMMARY

In some embodiments, the present invention discloses methods and systems for cleaning various articles, such as semiconductor substrate storage articles including containers, such as FOUP container doors and bodies. The FOUP containers and other similar articles often have openings, such as cavities or gaps, that may trap cleaning liquids during the cleaning process. Some of the trapped liquid may not be removed during the drying process, especially for high aspect ratio openings. The described cleaning system can include processes and components to prevent liquids from entering the hard-to-dry openings, thus can facilitate the drying process.

In some embodiments, the openings can be protected with a gaseous flow, for example, during the wet cleaning process. The gaseous flow can minimize or prevent the liquid from entering the openings, or can expel any liquid from the openings. The gaseous flow can assist in cleaning the openings, for example, through the gaseous flow or through a combination of liquid entering the openings and expelled by the gaseous flow.

In some embodiments, contact points can be provided for engaging the article and partially or completely covering these openings. The contact points may be also used for supporting the article and for pressurizing the openings in the article with a gas. The gas may be supplied through one or more contact points. It prevents liquids from getting into the openings if even the openings are not completely sealed. The pressurization may be maintained through the entire wet portion of the cleaning process. The article may be rotated within the cleaning system while cleaning and/or other liquids or gases are dispensed through a set of spraying nozzles. Spraying nozzles may move to enhance cleaning of the article.

BRIEF DESCRIPTION OF THE DRAWINGS

FIGS. 3A-3F illustrate various configurations for cleaning articles according to some embodiments.

FIGS. 4A-4D illustrate various configurations of openings in an article according to some embodiments.

FIG. 5 illustrates a flow chart for article cleaning according to some embodiments.

FIG. 7 illustrates a flow chart for cleaning an article according to some embodiments.

FIGS. 18 and 19A-19C illustrate various contact points for engaging an article during a cleaning process according to some embodiments.

FIGS. 20A-20D illustrate schematic configurations for cleaning nozzles according to some embodiments.

FIG. 21 illustrates a flow chart for cleaning an article according to some embodiments.

DETAILED DESCRIPTION OF EXAMPLE EMBODIMENTS

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In some embodiments, the present invention discloses systems and methods for cleaning articles. The cleaning process can include a wet cleaning, e.g., cleaning with a liquid, such as cleaning chemicals and water. The cleaning process can include a drying step, removing the liquids from the articles surfaces. The articles can have openings, such as gaps, cavities, holes, enclosures, apertures, orifices, or any other types of openings that can trap and retain liquid. For example, the openings can include a long narrow hole passing through the article. The openings can include a large cavity with a small aperture which accepts a bolt mechanism. The articles can be a semiconductor container that is configured to store one or more substrates such as wafers or reticles.

In some embodiments, the cleaning process can protect the openings from trapping and/or retaining liquid during the wet cleaning process. The protection can facilitate the subsequent drying process, since there can be minimal or no liquid in areas that are difficult to dry. The protection can be in the form of a gaseous flow, for example, from a gas nozzle directed toward the openings. The protection can be in the form of a blocking component, which partially or completely covers the openings to minimize or to prevent liquid from entering the openings.

In some embodiments, the present invention discloses methods and systems for cleaning semiconductor substrate storage containers and other articles, such as cassettes, holders, FOUPs, and MACs. While references are often made to FOUPs, one having ordinary skills in the art would understand that the described methods and systems can be also applied to other articles. In some embodiments, multiple different articles may be cleaned together or sequentially using the same cleaning apparatus. For example, the cleaning apparatus may be used for cleaning a body and a door of a FOUP unit in disassembled state. The FOUP unit may be provided for cleaning in its assembled state. The apparatus may disassemble, clean, dry, and re-assembly the FOUP unit. Furthermore, the apparatus may include certain inspection features to verify cleanness of an article after the cleaning is completed.

Figure 1A:
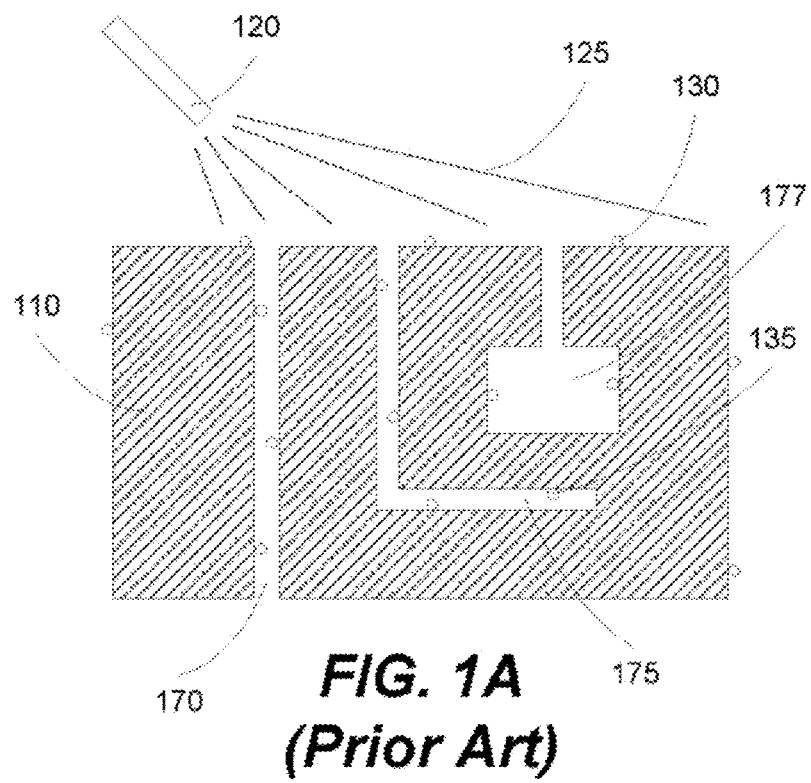
FIGS. 1A-1B illustrate a prior art cleaning process.
Figure 1B:
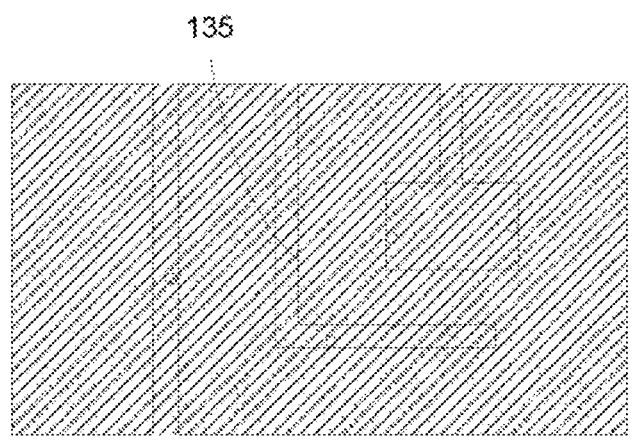

FIGS. 1A-1B illustrate an prior art cleaning process. An article 110 can be subjected to a cleaning process, for example, through nozzle 120 delivering cleaning liquid 125. The article 110 can have openings at the surface, such as through hole 170, gap 175, or cavity 177. During the liquid cleaning process, liquid droplets 130 and 135 can retain on the surfaces of the articles, including the inner surfaces of the openings 170, 175, and 177. For openings having high aspect ratio or blockage, the liquid droplet, e.g., droplet 135, can be trapped in the openings and can remain after a drying process to dry the article, e.g., to remove the liquid from the surfaces of the article.

The trapped liquid, e.g., liquid droplets that remain on the article even after the drying process, can contaminate the article. For example, the liquid droplets can be released from the article and contaminate a substrate. Alternatively, the liquid droplets can attract particulates, which can contaminate the article.

In some embodiments, the present invention discloses methods and system for cleaning articles without, or with minimum, liquid remained on the articles, even in trappable-liquid openings. The openings can be blocked, for example, by a physical cover or by a gaseous flow blockage, to prevent liquid droplets from being trapped in the openings or to prevent liquid droplets from being retained in the openings after a drying process.

Figure 2:
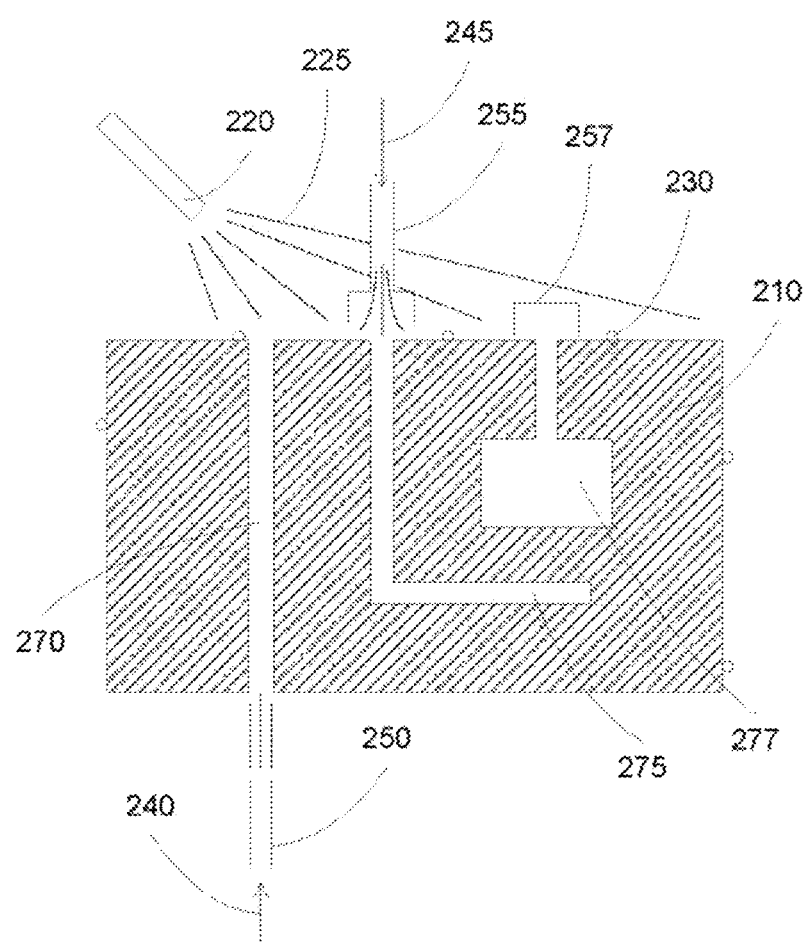
FIG. 2 illustrates a schematic cleaning system according to some embodiments.

FIG. 2 illustrates a schematic cleaning system according to some embodiments. An article 210 can be subjected to a cleaning process, for example, through nozzle 220 delivering cleaning liquid 225. Other cleaning process can be used, such as submerging the article to a liquid bath, or flowing liquid to the article until the article is submerged in a liquid. In the following description, liquid nozzles delivering liquid flows are shown for cleaning the articles, but the invention is not so limited, and can include other liquid cleaning processes, such as submerging the article in a liquid bath, or flowing an ultrasonic liquid, or ultrasonic treating the article. Further, a cleaning process can include washing the article for removing contaminates or particulates at the surfaces of the article. Thus chemical washing or water rinsing can be used.

The article 210 can have openings at the surface, such as through hole 270, gap 275, or cavity 277. The openings 270, 275, and 277 can be configured to provide blockage of liquid 225 from entering or from retaining in the openings. A nozzle 250 can be placed in a vicinity of the opening 270, and can deliver a gaseous flow 240 to the opening 270. The gaseous flow 240 can be positioned in one end of the openings 270 in a general direction of the liquid flow, for example, to prevent the liquid from entering the opening. The gaseous flow 240 can be positioned in another end of the openings 270 in an opposite direction of the liquid flow, for example, to push any liquid away from the opening. The gas flow 240 can assist in cleaning the opening 270, for example, by dislodging any particulates in the openings while minimizing or preventing liquid from being trapped in the opening, e.g., retaining in the opening after a drying process.

Contact points can be used to block the openings to prevent liquids from entering the openings. A contact point 257 can be used to block the opening 277, sealing the openings from the liquid environment. A contact point 255 together with a gaseous flow 245 can be used to block the opening 275. The contact point 255 can be placed in the vicinity of the opening 275, totally or partially blocking the opening. The gas flow 245 can assist in cleaning the opening 275, for example, by dislodging any particulates in the openings while minimizing or preventing liquid from being trapped in the opening, e.g., retaining in the opening after a drying process. Thus during the cleaning, liquid droplets 230 can retain on the surfaces of the articles, while no droplets or minimal droplets can stay inside the openings 270, 275, and 277. The absence of liquid droplets inside the openings can significantly simplify the subsequent drying process.

FIGS. 3A-3F illustrate various configurations for cleaning articles according to some embodiments. An article 310 can have an opening 370, which is subjected to a cleaning process, for example, by a liquid flow from a nozzle 320. In FIG. 3A, a nozzle 350 carrying a gas flow 340 can be directed toward the opening. The nozzle 350 can be placed perpendicular to the opening, blocking the opening. In FIG. 3B, nozzle 351 can form an angle with the opening surface, delivering a gas flow 341 at and near the opening. In FIG. 3C, a contact point 352 partially blocks the opening, together with a gas flow 342 to create a pressurized area at the vicinity of the opening. The partial blockage of contact point 352 can minimize particles due to contacting surface. In FIG. 3D, a contact point 353 blocks the opening, together with a gas flow 343 to create a pressurized area at the vicinity of the opening. In FIG. 3E, a contact point 354 having curve surface can be used to partially block the opening, with the gas flow 344 radially flowing toward the opening. In FIG. 3F, a contact point 355 partially blocks the opening, with an optional gas flow 345 from inside of the opening.

FIGS. 4A-4D illustrate various configurations of openings in an article according to some embodiments. In general, the opening can capture liquid droplets in a wet cleaning process, which are not easily removed during a subsequent drying process. For example, the opening can have a small aperture, for example, less than a few mm gap, such as less than 1 or 2 mm gap. The opening can have high aspect ratio, for example, greater than 10:1 (e.g., the depth is ten times the size of the opening), such as greater than 20:1 or 50:1.

An article 410 can have an opening 470 in the form of a hole passing through the article, e.g., from one surface to an opposite surface. The size of the opening 470 can be small or the aspect ratio of the opening can be high, which prevent any trapped liquid droplets in the opening from being removed during a drying process. An article 412 can have an opening 472, which is configured to contain a bolt 482. The bolt 482 can slide in and out of the opening 472, for example, to lock the article 412 with a mating article. The gap between the bolt and the opening can be small, thus any liquid droplets trapped in the inside volume of the opening can be difficult to remove. An article 414 can have an opening 474 in the form of a cavity having a smaller opening that the cavity volume. With the small aperture, trapped liquid droplets can be blocked from being removed at the aperture. An article 416 can have an opening 476 at the interface of two connecting walls. The opening 476 can be used to reduce the weight and material of the article at the reinforced corner.

FIG. 5 illustrates a flow chart for article cleaning according to some embodiments. Operation 500 provides an object. The object can have a liquid-trappable opening, e.g., an opening that can retain liquid droplets even after a drying process. For example, the opening can include a high aspect ratio cavity or gap. Operation 510 flows a gas in a vicinity of the opening, e.g., the high aspect ratio cavity or gap, to minimize liquid entering the opening or to push out any entered liquid. Alternatively, the opening can be blocked, pressurized with a gas, or partially or completely blocks together with flowing a gas. Operation 520 flows a liquid toward the object or cleans the object with a liquid.

In some embodiments, the present invention discloses systems and methods for cleaning articles, including cleaning with a liquid and then drying the object. The article can be cleaned while rotating for a complete surface cleaning process. A rotation mechanism can be used with supports for holding the article, together with liquid nozzles for delivering liquid to the article. A gas source can be coupled to the rotation mechanism to deliver gas flows to the article, for example, at openings of the article that need to be covered to prevent or to minimize wetting at the hard-to-dry openings.

Figure 6A:
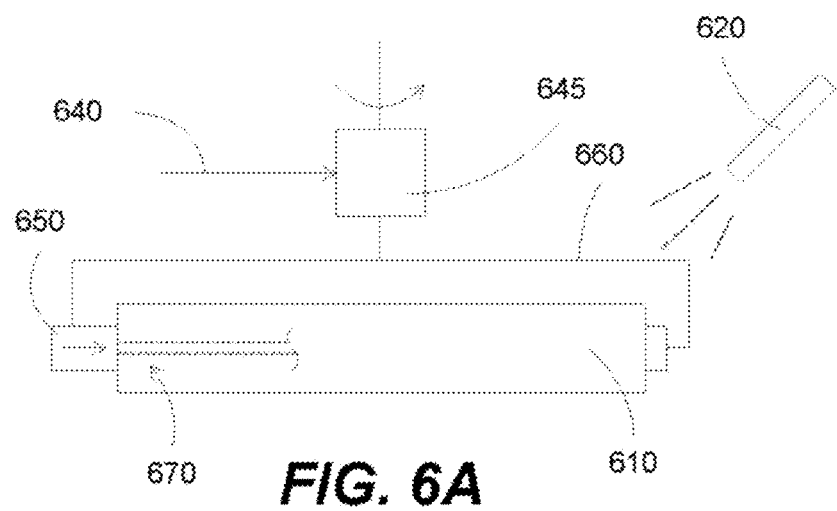
FIGS. 6A-6B illustrate a rotating cleaning system according to some embodiments.
Figure 6B:
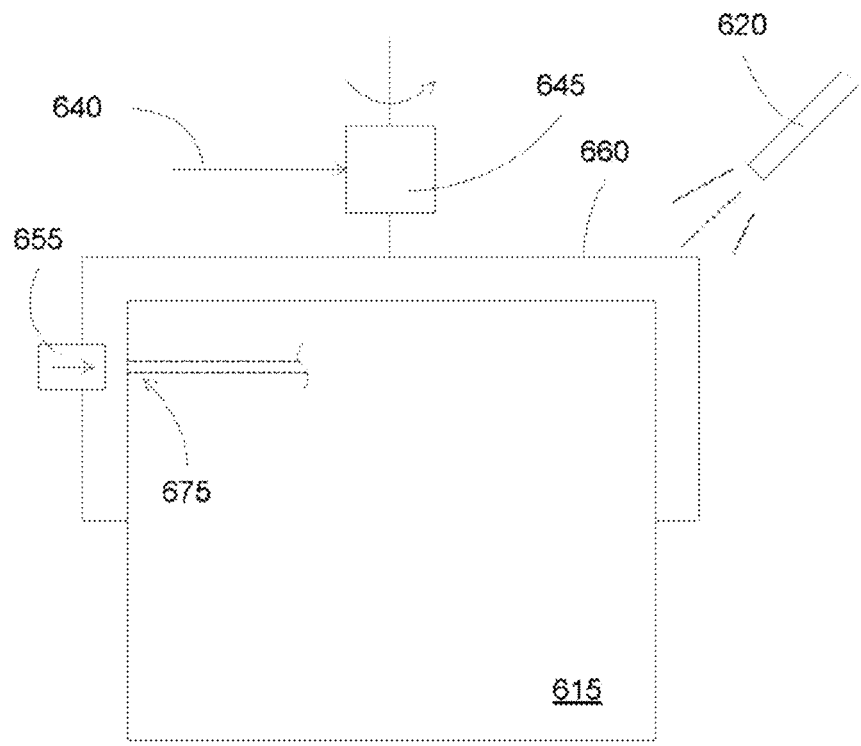

FIGS. 6A-6B illustrate a rotating cleaning system according to some embodiments. A rotation mechanism 645 can include supports 660, which can hold an article 610 or 615. A liquid source 620 can deliver a liquid flow to the article for cleaning or for rinsing. A gas source 640 can be coupled to the rotating mechanism, for example, through a rotatable seal. Gaseous nozzles or contact points 650 and 655 can be coupled to the support 660 to block openings 670 and 675. Gaseous nozzle 655 can deliver a gas flow to the opening 675. Gaseous nozzle 650 can form a contact point with the article at the opening 670 for generating a high flow high pressure area at the opening area, preventing liquid from entering the opening. As shown, the cleaning process is performed by liquid nozzle 620. Other cleaning mechanisms can be used, such as a liquid bath, or the liquid nozzle 620 flowing liquid to form a liquid bath for submerging the article.

FIG. 7 illustrates a flow chart for cleaning an article according to some embodiments. Operation 700 provides an object to be cleaned, wherein the object has an opening, such as a high aspect ratio cavity or gap. Operation 710 mounts the object to a rotating mechanism. The rotating mechanism can accept a gas flow, which can lead to a gas nozzle. Operation 720 aligns the gas nozzle with the opening, e.g., the high aspect ratio cavity or gap of the object. The gas nozzle can be placed in a vicinity of the opening, or the gas nozzle can totally or partially block the entrance to the opening. Operation 730 flows a gas to the gas source, which delivers the gas to the gas nozzle. Operation 740 flows a liquid toward the object for cleaning. Operation 750 rotates the object.

In some embodiments, the present invention discloses systems and methods for cleaning semiconductor containers, such as wafer containers or reticle containers. The following description uses FOUP as an example of semiconductor container, but other kinds of containers can be equally applicable.

A brief description of FOUP containers is provided to better illustrated various features of the cleaning apparatus. As noted above, a FOUP includes a FOUP door which mates with a FOUP body to provide a sealed, ultraclean interior environment in which wafers may be stored and transferred. The wafers are supported either in a cassette which may be inserted into the body, or to shelves mounted to the interior of the body.

Figure 8A:
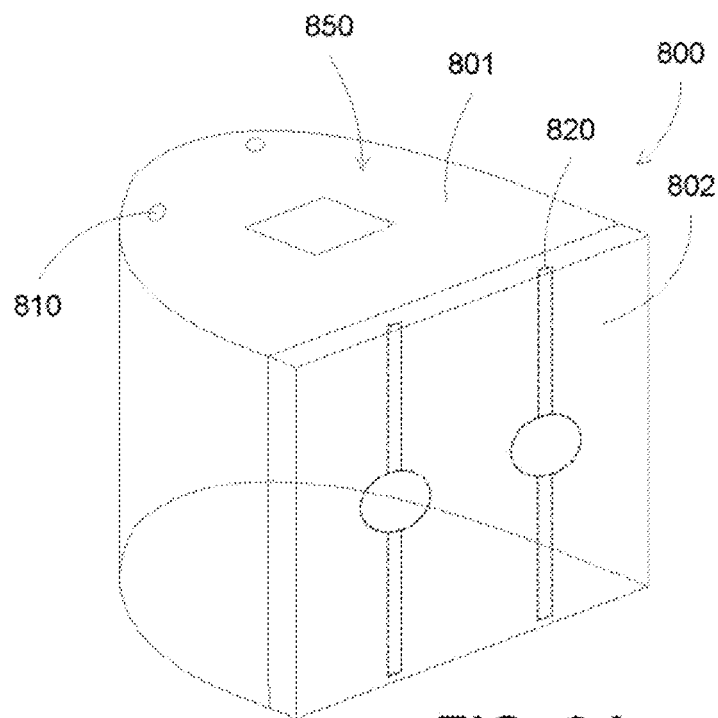
FIGS. 8A-8B illustrate perspective views of a FOUP container according to some embodiments.
Figure 8B:
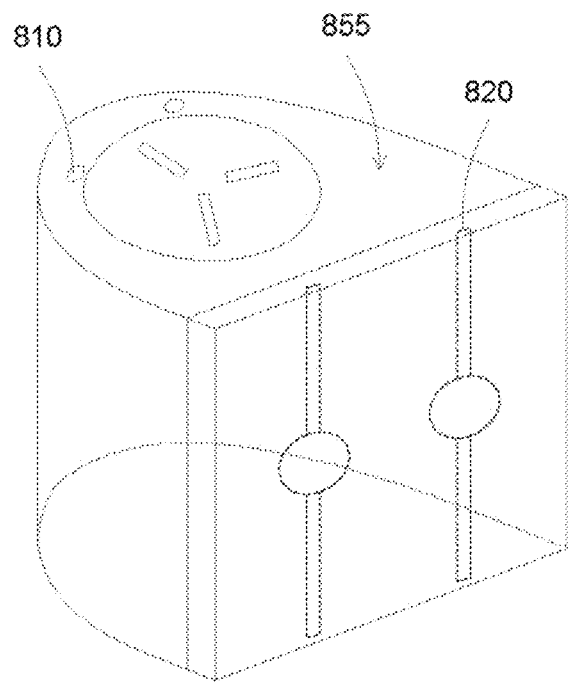

FIGS. 8A-8B illustrate perspective views of a FOUP container according to some embodiments. FIG. 8A shows a perspective view from a top side 850 and FIG. 8B shows a perspective view from a bottom side 855 of a FOUP 800. The FOUP 800 can include a FOUP door 802 coupled to a FOUP body 801. The FOUP can have some openings which can trap and retain liquid during a cleaning process. The openings can be configured so that it can be nearly impossible to remove the trapped liquid or can take a long drying time or special drying components. For example, the FOUP door 802 can have a latching mechanism 820 for locking the FOUP door 802 with the FOUP body 801. The mechanism 820 can have opening leading to an inner cavity that houses the locking mechanism. The FOUP body 801 can have some pass through holes 810.

Figure 9A:
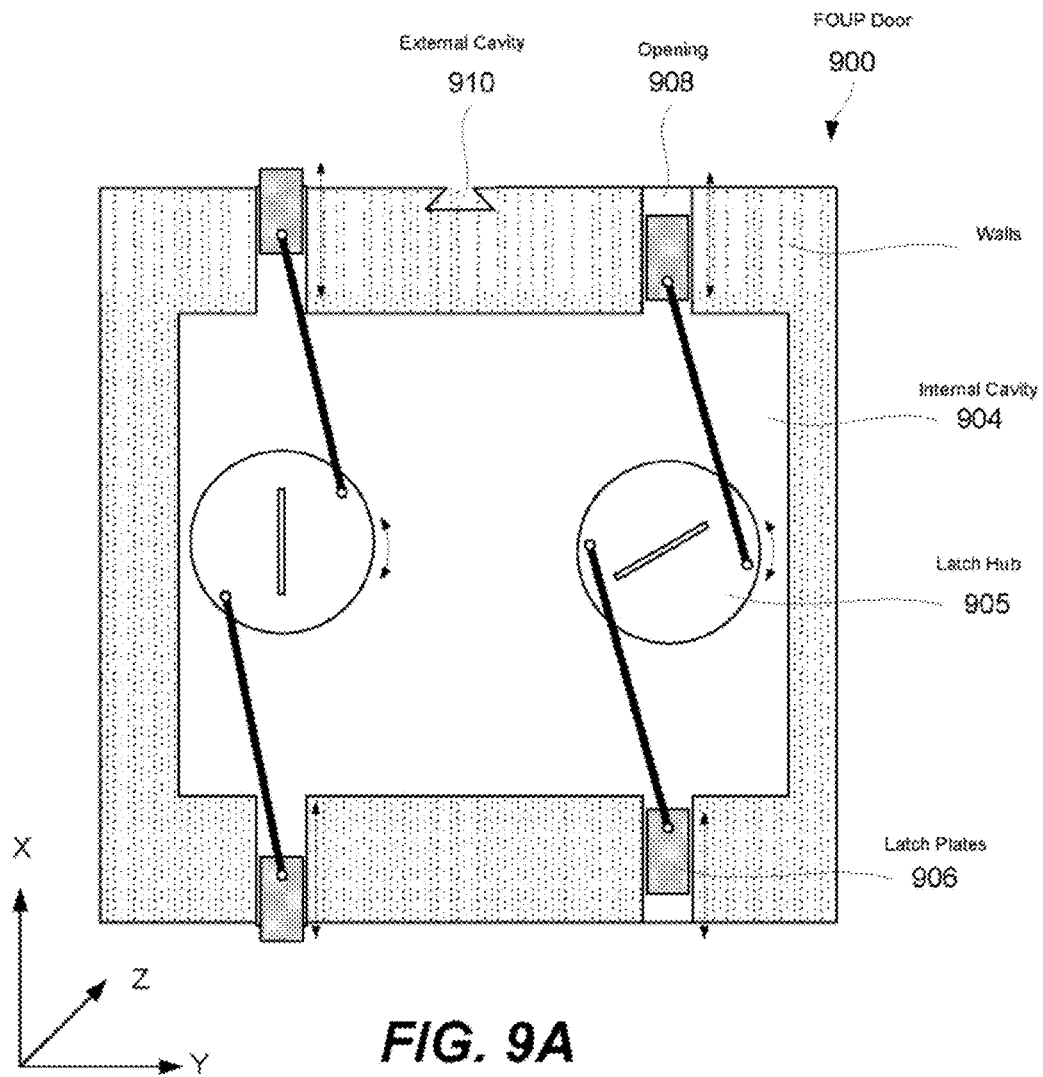
FIGS. 9A-9B illustrate a schematic representation of a FOUP door according to some embodiments.
Figure 9B:
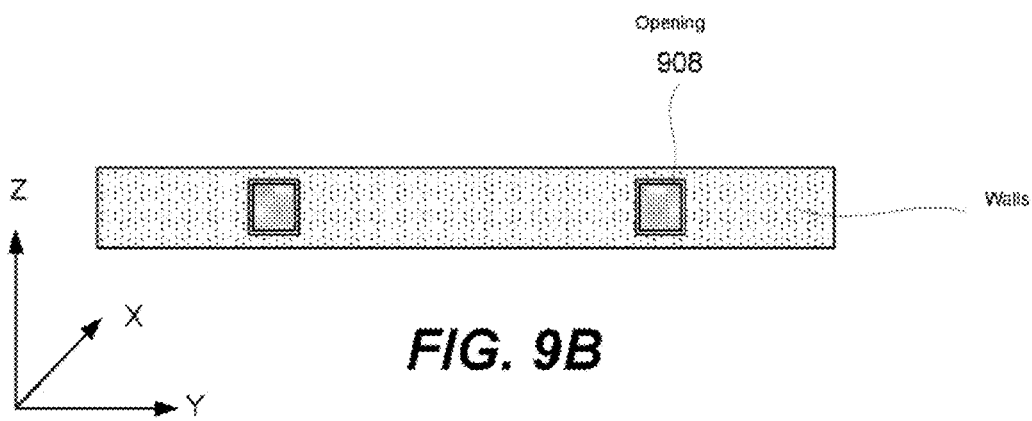

FIGS. 9A-9B illustrate a schematic representation of a FOUP door according to some embodiments. FIG. 9A shows a schematic top view and FIG. 9B shows a schematic side view of a FOUP door 900 illustrating various openings within FOUP door 900. FOUP door 900 includes multiple latch plates 906 that slide within openings 908. Latch plates 906 are connected to latch hubs 905 that control the position and movement of latch plates 906. Specifically, two latch hubs 905 are shown within internal cavity 904 of FOUP door 900. Each latch hub 905 is configured to actuate two opposite latch plates 906 in this example. When latch hub 905 is turned, it moves latch plates 906 within openings 908. Latch plates 906 can extend outside of openings 908 for engaging with, e.g., the FOUP body. In order to disengage FOUP door 900 from the FOUP shell, latch plates 906 are retracted back into openings. The latch plate 906 can be slightly smaller than the opening 908 so that the latch plate can slide through. The gap in the opening 908 from the latch plate 906 to the FOUP door material surrounding the latch plate can be small, for example, less than 10×, less than 20×, or less than 50× the length of the latch plate. For example, the gap can be less than 2 mm, less than 1 mm, or less than 0.5 mm. The latch plate can be greater than 50 mm, greater than 20 mm, or greater than 10 mm.

When FOUP door 900 is sprayed with a cleaning liquid or submerged into the cleaning liquid, the liquid may get into openings 908 and eventually into internal cavity 904. If that happens, it may be extremely difficult to remove the liquid from internal cavity 904 and/or openings 908. At the same time, it is not desirable to use FOUP door 900 until all liquid is removed. In some embodiments, openings 908 are protected when FOUP door 900 is exposed to liquids. In addition to openings 908 extending into internal cavity 904, FOUP door 900 or some other similar articles may include external cavity 910, which may also trap liquids. For purposes of this disclosure, any cavity, recess, or other surface feature capable of trapping liquid is referred to an opening.

In some embodiments, the present invention discloses protecting openings that can trap and retain liquid after a reasonable drying process. For example, the openings 908 can trap liquid into the internal cavity 904. The trapped liquid can be retained within the cavity 904 even after prolong drying time, such as spin dry or heated dry, since the openings 908 can have high aspect ratio and small aperture size, leading to low escape probability of the trapped liquid. The opening 910 can trap also liquid, but since the aspect ratio is small, the trapped liquid can be removed in a normal drying process such as a spin dry, a vacuum dry or a heated dry process.

Some or all openings may be protected by a gas flow, or covered by contact points while the article is being cleaned. The same contact points may be used to support the article during the cleaning process. Alternatively, support points can be used for support the article, while the contact points are configured to protect the openings. Gas flow can be provided to the contact points, for example, to pressurize the openings and/or cavities, such that the cleaning liquid does not enter these openings and/or cavities even if the seal is not completely formed between the contact point and the article.

In some embodiments, an opening may be pressurized to between about 1-100 kPa relative to the pressure inside the cleaning chamber.

It should be noted that any openings of an article being cleaned may be covered using methods and systems provided herein. For example, a FOUP body may have high aspect ratio holes for reducing FOUP weight, which can retain liquid even after a drying process. These holes may be covered with contact points or protected by a gas flow.

Figure 10A:
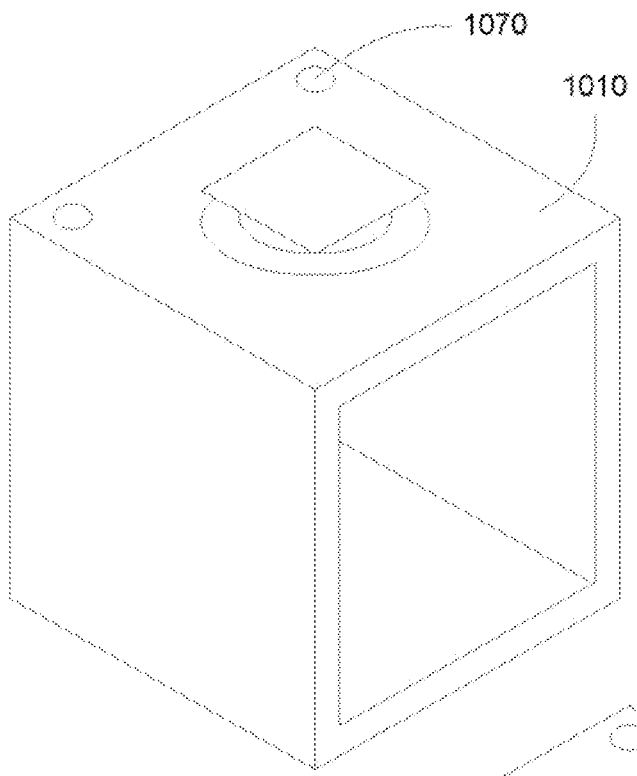
FIGS. 10A-10B illustrate a schematic representation of a FOUP body according to some embodiments.
Figure 10B:
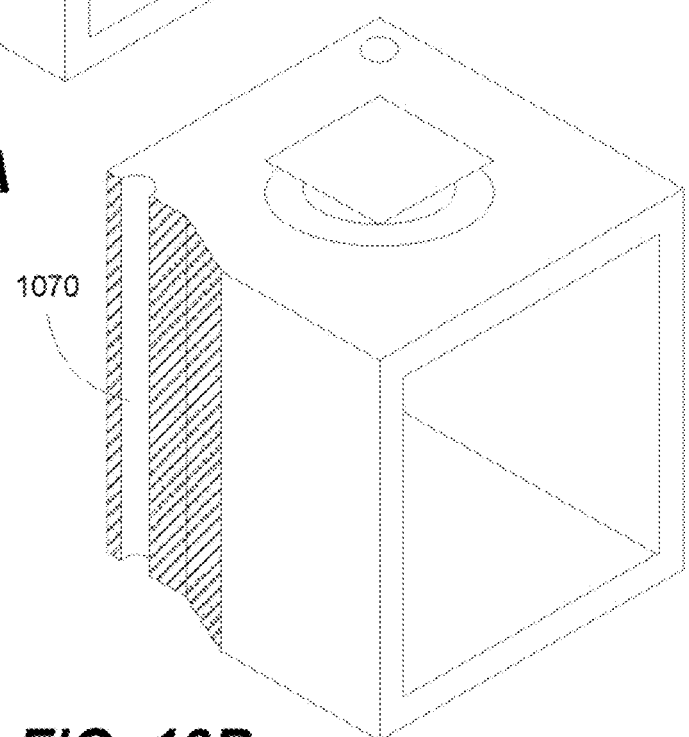

FIGS. 10A-10B illustrate a schematic representation of a FOUP body according to some embodiments. FIG. 10A shows a perspective view and FIG. 10B shows a cut away view of a FOUP body 1010 illustrating various openings within FOUP body 1010. The FOUP body 1010 can have through holes 1070 at corners of the FOUP body, running from the top face to the bottom face. At the corner of the FOUP body, reinforced features can be added to connect the side walls of the FOUP. The reinforced features can strengthen the structure of the FOUP, but at the expense of weight increase. Through holes 1070 can reduce the weight without affecting the structural integrity of the FOUP body. During the cleaning of the FOUP body, the through holes 1070 can be protected with a gas flow or a contact point to prevent or minimize the liquid entering the through holes, leading to a simplified drying process.

Figure 11:
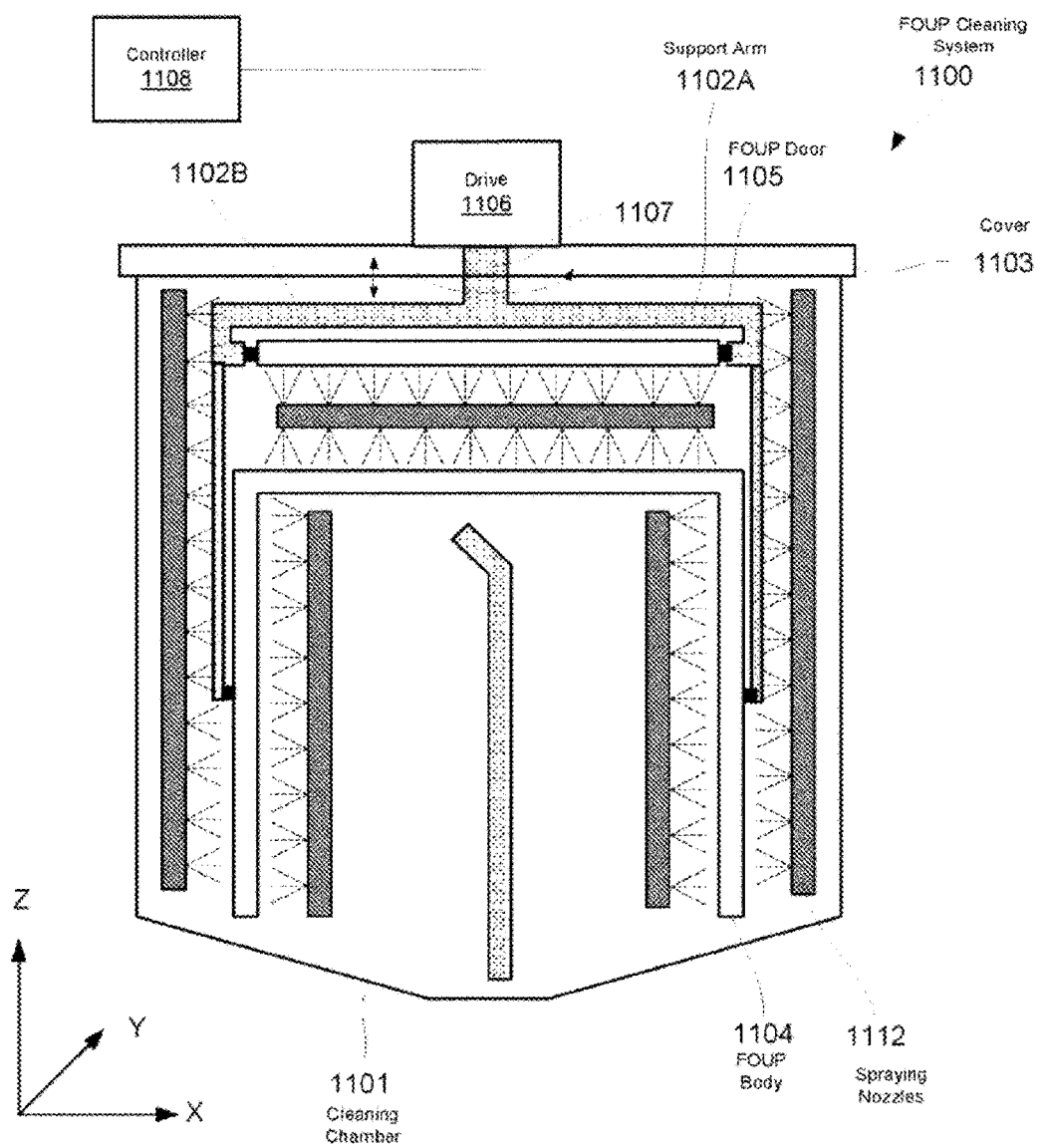
FIG. 11 illustrates a schematic cleaning system according to some embodiments.

FIG. 11 illustrates a schematic cleaning system according to some embodiments. A cleaning system 1100 includes a cleaning chamber 1101 and cover 1103. Cover 1103 may be removed from cleaning chamber 1101 during loading and unloading of article 1104 (such as a FOUP body) and article 1105 (such as a FOUP door) for cleaning. Cover 1103 may be positioned over cleaning chamber 1101 to isolate the internal environment of cleaning chamber 1101 from the external environment during cleaning. This isolation can reduce the losses of cleaning and drying liquids and gases and, in general, to maintain different conditions in the internal environment in comparison to the external environment. A seal may be provided at the interface between cover 1103 and cleaning chamber 1101. In some embodiments, cover 1103 may be movable, while cleaning chamber 1101 may remain stationary. Alternatively, cover 1103 may be stationary, while cleaning chamber 1101 may be movable. In some embodiments, both cover 1103 and cleaning chamber 1101 are movable. Overall, cover 1103 may move relative to cleaning chamber 1101 at least in the Z direction, such that when cover 1103 is raised over cleaning chamber 1101 and/or cleaning chamber 1101 lowered relative to cover 1103 an external article handling system (not shown) can access and remove articles 1104 and 1105 after cleaning and/or position new articles for cleaning.

Cover 1103 may serve as a supporting base for multiple support arms 1102A and 1102B and/or drive mechanism 1106. In some embodiments, a main portion of drive mechanism 1106 is positioned on the external side of cover 1103, while multiple support arms 1102A and 1102B are provided on the internal side of cover 1103. This orientation of drive mechanism 1106 protects drive mechanism 1106 from cleaning and/or liquids as well as protects the internal environment from contamination that drive mechanism 1106 may cause. In some embodiments, drive mechanism 1106 position on the internal side of cover such that no moving parts protrude through the cover.

In some embodiments, article 1104 is movable with respect to spaying nozzles 1112. It should be noted that article 1104 may or may not be movable with respect to cleaning chamber 1101. For example, spaying nozzles 1112 may be movable relative to cleaning chamber 1101 and article 1104, while article 1104 may be stationary relative to cleaning chamber 1101. Alternatively, spaying nozzles 1112 may be stationary relative to cleaning chamber 1101, while article 1104 may be movable relative to cleaning chamber 1101 and spraying nozzles 1112. Article 1104 may be also supported and, in some embodiments, moved by support arms 1102A and 1102B or some other devices that may be attached to support arms 1102A and 1102B, directly to shaft 1107 of drive mechanism 1106 or some other drive.

Drive mechanism 1106 may include a drive shaft 1107 that is attached to multiple support arms 1102A and 1102B in order to rotate support arms 1102A and 1102B inside cleaning chamber 1101. Drive mechanism may be also used to move multiple support arms 1102A and 1102B relative to each other when, for example, engaging article 1105. This configuration may be referred to as movable supporting arm. For example, support arms 1102A and 1102B may tilt relative to drive shaft 1107 in order to engage or disengage article 1105. Alternatively, support arms 1102A and 1102B may remain stationary when engaging or disengaging article 1105. It should be noted that both types of support arms 1102A and 1102B (i.e., movable and stationary) are rotated within chamber 1101 during cleaning of article 1105 such that all sides of article 1105 are exposed to different spraying nozzles 1112.

Drive mechanism 1106 may be controlled by signals received from a system controller 1108. Controller 1108 may be also configured to control operations of various other components, such as spraying nozzles 1112, gas delivery line, cover moving mechanism, and others. Controller 1108 may include one or more memory devices and one or more processors with a central processing unit (CPU) or computer, analog and/or digital input/output connections, stepper motor controller boards, and the like. In some embodiments, controller 1108 executes system control software including sets of instructions for controlling timing of operations, temperatures and flow rates of cleaning and/or other liquids, temperatures and/or flow rates of drying gases, ultrasonic nozzle operations, and other parameters. Other computer programs and instruction stored on memory devices associated with controller may be employed in some embodiments.

As noted above, the rotation of supporting arms 1102A and 1102B is provided by drive mechanism 1106, which may include an electrical motor, a pneumatic motor, or some other type of motor. The motor may be coupled to a gear box to provide desired rotational speed. In some embodiments, the rotation speed may be between about 1 RPM and 100 RPM or, more specifically, between about 5 RPM and 25 RPM, e.g., between about 8 RPM and 10 RPM.

The rotation may start after engaging article 1104 with supporting arms 1102A and 1102B or, more specifically, with contact points attached to ends of supporting arms 1102A and 1102B. The rotation continues during dispensing of a cleaning liquid and/or rinsing liquid onto article 1105 and, in some embodiments, during drying of article 1105 within cleaning chamber 1101. As noted above, the rotation allows exposing different portions of article 1105 to different spraying nozzles 1112 provided within cleaning chamber 1101. Furthermore, the rotation may be used to provide additional or different shear forces when the cleaning liquid hits that the surface of article 1105, which may provide additional cleaning action and help to dislodge particles from the surface. Another function of this rotation involves removing liquid droplets from article by creating a centrifugal force.

The contact points attached to the ends of supporting arms 1102A and 1102B engage article 1105 and, in some embodiments, cover one or more openings of article 1105. As such, the contact points are used to prevent liquids from getting into the openings. This may be referred to as sealing of the openings. In some embodiments, the contact points include a flexible material to improve sealing at the interface with article 1105. Furthermore, the size of the contact points may be larger than the size of the openings to accommodate some misalignment.

Contamination of openings in article 1105 may be also prevented by pressurizing these openings. For example, at least one of the contact points may be used to supply a gas into a corresponding opening of article 1105. This supply of gas may pressurize this opening and, in some embodiments, other openings if these other openings are internally coupled and can received the gas through the article and from the opening that faces the gas supplying contact point. In some embodiments, multiple contact points and even all contact points engaged with article 1105 may be configured to supply gas. The gas may be supplied to the contact points through one or more gas flow channels provided within the supporting arms. In some embodiments, the gas supplied to a contact point is also used to move this contact point with the respect to the remaining portion of the support arm.

When article 1104 and, in some embodiments, article 1105 are positioned within cleaning chamber, a set of spraying nozzles 1112 can be used to direct cleaning and/or other liquids onto the articles. Spraying nozzles 1112 can deliver cleaning liquid, rinsing liquid (e.g., deionized water), and other types of liquid (e.g., surfactant and metal removal agent) designed for cleaning and decontaminating the article. In some embodiments, liquids may be mixed and delivered together with gases (e.g., a carrier gas). The amount of liquid and/or carrier gases can be carefully controlled, for example, to form fine droplets and aerosol gas bubbles together with the carrier gas.

In some embodiments, spraying nozzles 1112 may be also used to deliver drying liquids (e.g., isopropanol alcohol) and drying gases to the surfaces of the article. For example, fast evaporating liquid, such as alcohol and other liquids low boiling temperature and high vapor pressure, may be used for cleaning and/or to adsorb other cleaning liquids that may remain on the surface of the article. Some examples of carrier gases and/or drying gases include nitrogen, air, argon, and other inert gases.

In some embodiments, temperature of carrier and/or drying liquid and gases may be specifically controlled to assist with cleaning and drying, e.g., evaporating rinsing liquids from the surface of articles 1104 and 1105. For example, the temperature may be between about 40° C. and 80° C., such as about 60° C. Lower temperatures may be less effective for cleaning and drying, while higher temperatures may be damaging to the article being cleaned and/or components of cleaning apparatus 1100. In some embodiments, liquid vapors can be removed from cleaning chamber by fast exhaust and low chamber pressure, for example, by purging with dry gas and/or by maintaining a vacuum pressure inside the cleaning chamber during the liquid cleaning cycle. High flow rate may be used for effective cleaning. In some embodiments, a flow rate through each nozzle may be between about 0.1 liters per minute to about 10 liters per minute. Furthermore, ultrasonic nozzles may be used for additional cleaning efficiency.

In some embodiments, spraying nozzles 1112 can be positioned near surfaces of articles 1104 and 1105, in particular near corners, such as inner corners and outer corners. For flat articles, such as a FOUP door, the spraying nozzles may be posited next to flat surfaces and/or around the ends. For partially enclosed articles, such as a FOUP shell, the sparing nozzles may be positioned both inside and outside of these articles. In some embodiments, the partially enclosed articles may be positioned such their openings face downward to allow removal of the cleaning liquid from the container by gravity.

The number of nozzles and the locations of the nozzles are designed to simplify apparatus design and to maximize effective cleaning. Specifically, the number and location of the spraying nozzles may be designed to effectively distribute the liquid being dispensed onto the article surfaces. For example, some spray nozzles may be located in high positions in order to spray generally downward, i.e., in the direction of the gravity. Some nozzles may point toward the corners of the article for effective cleaning.

A brief description of a process for loading articles 1104 and 1105 into cleaning chamber 1101 will now be presented to provide better understanding of various features and design considerations of cleaning system 1100. In some embodiments, articles 1104 and 1105 are provided to system 1100 as separate components that have previously disassembled, e.g., a FOUP cover removed from a FOUP shell. Cover 1103 of system 1100 may be raised together with supporting arms 1102A and 1102B and other components. Alternatively or in addition to raising cover 1103, chamber 1101 may be lowered relative to cover 1103. The transfer system may then load article 1104 onto supports (not shown) provided within cleaning chamber 1101. In some embodiments, these supports may be removed from within cleaning chamber 1101 for ease of loading. As noted above, the supports may be attached to supporting arms 1102A and 1102B or other components of drive mechanism 1106.

Article 1105 may be aligned relative to supporting arms 1102A and 1102B such that minimal travel of supporting arms 1102A and 1102B is needed to engage article 1105. This alignment may involve movement of the transfer system that supports article 1105 (and, in some embodiments, article 1104) prior to engaging this article with supporting arms 1102A and 1102B and/or movement of cover 1103. Cover 1103 may move in the Z direction and, in some embodiments, in the X and Y directions. The process proceed with engaging article 1105 with supporting arms 1102A and 1102B, which may involve moving portions of supporting arms 1102A and 1102B in the X direction. At this point, the transfer system may disengage and retrieve. Cover 1103 may be then lowered onto chamber 1101 and/or chamber 1101 raised to cover 1103. Cover 1103 may be sealed relative to chamber 1101 at this point to prevent cleaning liquids and gases from escaping.

The process may then proceed with cleaning articles 1104 and 1105 inside cleaning chamber 1101. Specifically, cleaning articles 1104 and 1105 may move relative to spraying nozzles 1112 while spraying nozzles 1112 deliver cleaning liquids onto articles 1104 and 1105. The process may also involve rinsing and drying of articles 1104 and 1105 prior to disengaging cover 1103 from cleaning chamber 1101. Cover 1103 is lifted relative to cleaning chamber 1101 in order to gain access to articles 1104 and 1105. In some embodiments, one or both articles 1104 and 1105 are lifted together with cover 1103. To disengage article 1105 from supporting arms 1102A and 1102B, at least portions of supporting arms 1102A and 1102B are moved in the X direction. Cover 1103 may be then placed onto cleaning chamber 1101.

In some embodiments, supporting arms 1102A and 1102B may be in a form of a shelf that can form one or more support planes for holding articles 1104 and 1105. Each supporting plane may be formed by one or more components. In these embodiments, supporting arms 1102A and 1102B may be stationary at least during engagement of articles 1104 and 1105 may be slid into the shelf by the transfer system. Nevertheless, supporting arms 1102A and 1102B may rotate relative to spraying nozzles within the plane formed by the X and Y axes and more along the Z axis.

Figure 12A:
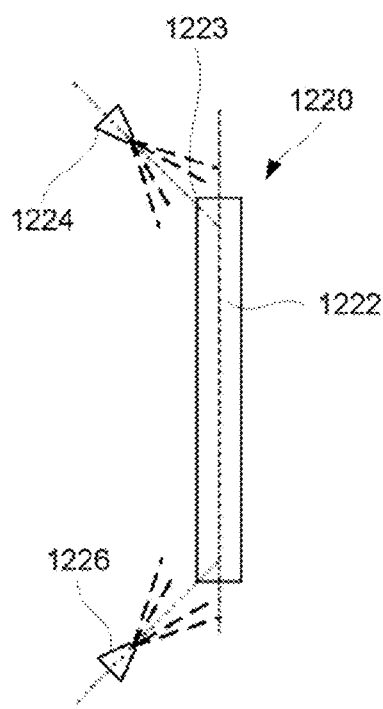
FIGS. 12A-12B illustrate schematic cleaning processes for a container lid according to some embodiments.
Figure 12B:
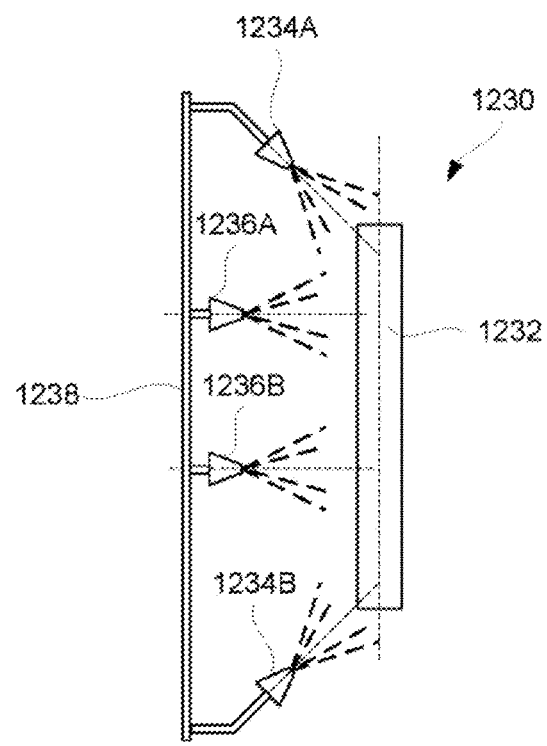

FIGS. 12A-12B illustrate schematic cleaning processes for a container lid according to some embodiments. FIG. 12A shows a schematic illustration of a nozzle configuration 1220 including two spraying nozzles 1224 and 1226 positioned at the corners of an article 1222 during cleaning and/or drying of this article. Specifically, a center line 1223 of spraying nozzle 1224 is shown to coincide with corner 1223 such that the flow of liquid or gas discharged from nozzle 1224 may be split between two different surfaces of article 1222. Overall, positioning nozzles 1224 and 1226 at the corners of article 1222 allow each nozzle to cover at least portions of two different surfaces of article 1222. Furthermore, corners tend to be more prone to contamination than, e.g., flat surfaces, and may be harder to clean if a nozzle is directed to one surface and not the other. In some embodiments, nozzles 1224 and 1226 may pivot to ensure that at some point their center lines (e.g., center line 1223 of spraying nozzle 1224) will pass through the corners (e.g., corner 1223).

FIG. 12B shows a schematic illustration of another nozzle configuration 1230 that includes four spraying nozzles 1234A-B and 1236A-B, in accordance with some embodiments. All four spraying nozzles 1234A-B and 1236A-B are connected to manifold 1238 that may be used to support all nozzles and deliver liquid and/or gas to all nozzles. Manifold 1238 can be positioned at various distances and angles relative to article 1232. For example, manifold 1238 may extend parallel to the surface of the article. In some embodiments, manifold 1238 may be positioned vertically to improve liquid draining from manifold 1238. In some embodiments, one or more nozzles may be pivoted with respect to supporting manifold.

Spraying nozzles may be distributed on a manifold to cover different corners and surfaces. For example, two spraying nozzles 1234A and 1234B are positioned at the corners of article 1232, while two other spraying nozzles 1236A and 1236B are directed at one surface of this article. The nozzles may be positioned to provide complete coverage of the surface and to ensure complete cleaning of that surface. In some embodiments, an article and nozzles are moved with respect to each other to ensure complete coverage of surfaces and, in some embodiments, to direct liquid and/or gas at different angles to the surface.

In some embodiments, nozzles deliver liquid and/or gas at an angle other than the normal relative to the surface being (i.e., provide some angle flow), which results in a shear force onto the surface to dislodge particles and other contaminants from the surface. Furthermore, the angle flow can provide a greater surface coverage. In some embodiments, the nozzle may turn relative to the surface being cleaned in order to cover more surface area and/or clean the surface with different shear and other forces.

A cleaning liquid supplied through the nozzles may include additives, such as surfactant, detergent, or contamination/metal removal agents. These additives may be added into the water or other liquid, for example, by aspiration or pumping. The contamination/metal removal agent can be a metal removal agent, such as a chelating agent. A high alkaline detergent may be used in place of the surfactant. UV light can be added, for example, to aid removal of contamination. After completing cleaning and/or contamination removal, the article is then rinsed using a rinsing liquid, such as DI water. Cyclic cleaning/rinsing processes can be performed for effective cleaning. The cleaning liquid can be collected for recycling.

In some embodiments, the nozzles dispense small liquid droplets to aid in the subsequent drying process. In addition, purged gas or liquid spray can be provided to break droplets into even smaller ones. In the areas where the liquid tend consolidated (such as bottoms), gas or liquid spray can be provided to break large liquid accumulations into smaller droplets, such as by blowing the liquid away.

Furthermore, the nozzle may be used for delivering dry air, inert or non-reactive gas. For example, after loading the article, the air within the process chamber can be evacuated and replaced with a process gas, such as inert (e.g., argon) or non-reactive gas (e.g., nitrogen). In some embodiments, the chamber is purged during liquid cleaning. The chamber may be sealed and maintained at sub-atmospheric pressure, for example, to aid in removing liquid vapor within the process chamber ambient. The reduced pressure can be less than 100 Torr, such as less than 10 Torr and even less than 1 Torr. In some embodiments, the liquid or gases supplied through the nozzles can be heated to increase the volatility. Heated liquid can be recycled to reduce energy cost. In addition, the article and the process chamber can also be heated, for example, by IR or UV lamps.

After cleaning, the container can be rinsed. Optional gas purge, such as hot air flow, can be utilized to further reduce the amount of liquid remaining on the container surfaces. The nozzles can also be configured to provide liquid for cleaning, liquid for rinsing, and gas for pushing liquid away from the container surface.

In some embodiments the cleaning system can include an assembly for supporting, rotating, and/or moving the article while this article is being cleaned. The assembly can include a rotatable seal to accept a stationary gas source inlet while delivering a rotating gas flow to the rotating article.

Figure 13A:
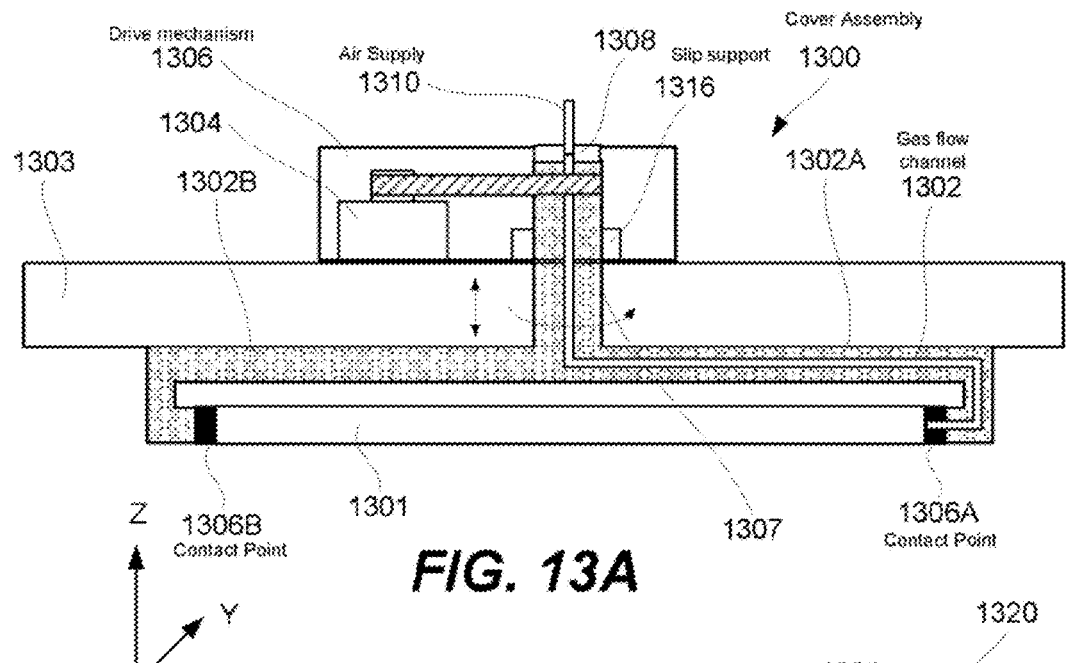
FIGS. 13A-13D illustrate schematic view of an assembly supporting a FOUP door for cleaning according to some embodiments.

FIGS. 13A-13D illustrate schematic view of an assembly supporting a FOUP door for cleaning according to some embodiments. FIG. 13A shows a schematic side view of an assembly 1300 for cleaning a FOUP door. This assembly 1300 may be used for supporting a FOUP door 1301 and/or some other articles, e.g., a FOUP body. The configuration of the assembly may change depending on the article being supported.

Assembly 1300 may include a cover 1303, a drive mechanism 1306, and multiple supporting arms 1302A and 1302B connected to drive mechanism 1306 using drive shaft 1307. Assembly 1300 may be referred to as a cover assembly as cover 1303 may be used for support of all other components. Drive mechanism 1306 may include a motor 1304 for rotating drive shaft 1307 and slip support 1316 (e.g., bearing) for supporting drive shaft 1307 relative to non-moving parts, such as cover 1303 or a case of drive mechanism 1306. In some embodiments, drive shaft 1307 has a gas flow channel 1302 that extends into one or more supporting arms (e.g., supporting arm 1302A). The gas may be supplied into gas flow channel 1302 from a stationary gas supply line 1310, which may be connected to gas flow channel 1302 using a slip coupling 1308. It should be noted that gas flow channel 1302 is different from channels connected to spraying nozzles.

Each supporting arm includes a contact point for engaging with an article. Supporting arm 1302A includes contact point 1306A, while supporting arm 1302B includes contact point 1306B. Other supporting arms and contact points can be used. Two opposite contact points 1306A and 1306B are configured to move relative to each other at least along the X axis. When article 1301 is provided and aligned with contact points 1306A and 1306B, contact points 1306A and 1306B are further away from each other than when contact points 1306A and 1306B engage article 1301. This may be referred to as open and closed positions of contact points 1306A and 1306B. The travel between open and closed positions of contact points 1306A and 1306B may be between about 10 millimeters and mm and 100 millimeters.

Contact points 1306A and 1306B may be moved relative to each other by moving one or both contact points 1306A and 1306B relative to their supporting arms 1302A and 1302B and/or by moving supporting arms 1302A and 1302B relative to, e.g., drive shaft 1307. For example, supporting arms 1302A and 1302B may pivot relative to drive shaft 1307 resulting in a scissor-like action. In the same or other embodiments, ends of supporting arms 1302A and 1302B include one or more actuators for moving one or both contact points 1306A and 1306B relative to supporting arms 1302A and 1302B. The actuators may be driven pneumatically, hydraulically, or electrically.

The number of contact points 1306A and 1306B may be defined by the number of openings in an article that is being cleaned. In some embodiments, each opening has a corresponding contact point. For example, a FOUP door may have four openings, each having a separate latch plate. An assembly used to support this FOUP door may include four contact points, each being aligned and engaged with the separate opening. In other embodiments, one contact points may be used to cover multiple openings. Some contact points may be load bearing contact points (i.e., to support the weight of the article that is being cleaned), while other may be used to cover the opening and without supporting any weight of the article.

Figure 13B:
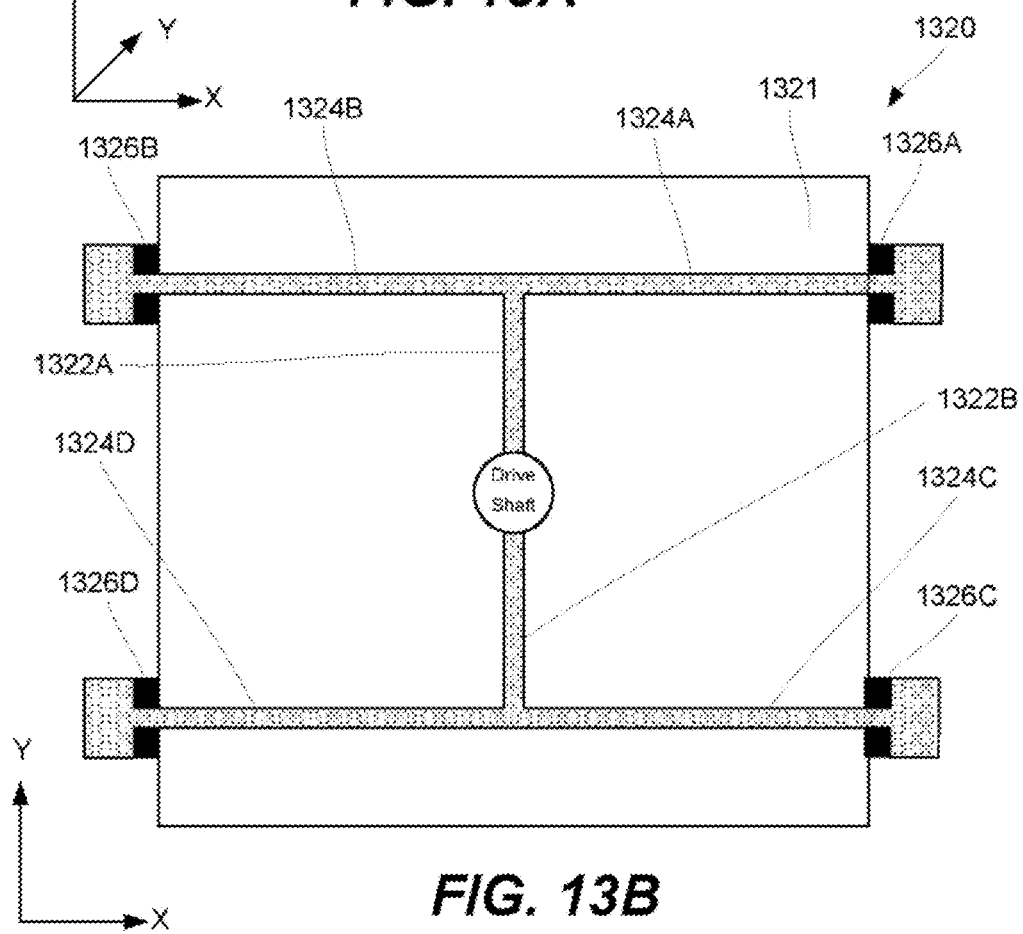
Figure 13C:
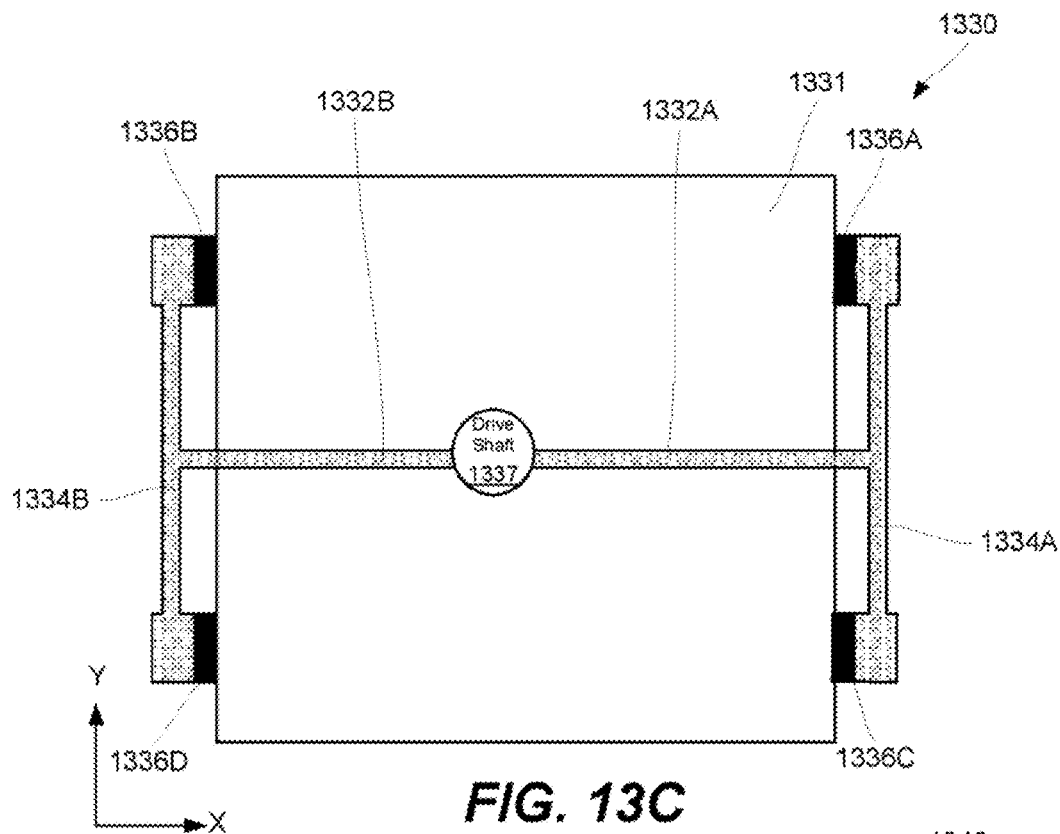
Figure 13D:
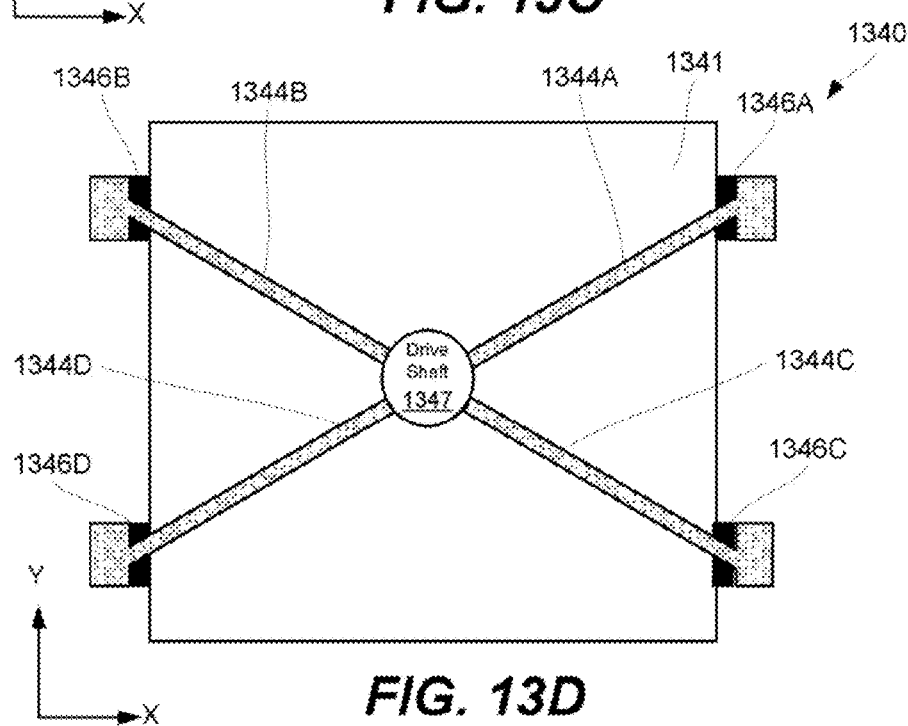

FIGS. 13B-13D show schematic top views of different assemblies, each including a drive and multiple supporting arms, in accordance with some embodiments. Specifically, FIG. 13B shows a configuration 1320 in which each one of contact points 1326A-1326D is attached to a separate supporting arm, i.e., contact point 1326A is attached to supporting arm 1324A, contact point 1326B is attached to supporting arm 1324B, contact point 1326C is attached to supporting arm 1324C, and contact point 1326D is attached to supporting arm 1324D. Furthermore, from an article engagement standpoint, contact point 1326A and contact point 1326B are opposite to each other and so are contact point 1326C and contact point 1326D. In this configuration, contact point 1326A is configured to move relative to contact point 1326B, while contact point 1326C is configured to move relative to contact point 1326D to engage an article 1321. In some embodiments, contact point 1326A can be moved relative to contact point 1326C, e.g., to align these contact points 1326A and 1326C relative to openings in article 1321. In a similar manner, contact point 1326C can be moved relative to contact point 1326D.

Supporting arms 1324A-1324D may be attached to a pair of cross-bars 1322A and 1322B. Specifically, supporting arms 1324A and 1324B may be attached to cross-bar 1322A, while supporting arms 1324C and 1324D may be attached to cross-bar 1322B. In some embodiments, movement of cross-bars 1322A and 1322B determines movement of contact points 1326A-1326D in the Y direction, which may be used to align opening in article 1321 with contact points 1326A-1326D. In the same or different embodiments, supporting arms 1324a and 1324B can move relative to cross-bar 1322A determining movement of contact points 1326A and 1326B in the X direction, and supporting arms 1324C and 1324D can move relative to cross-bar 1322B determining movement of contact points 1326C and 1326D in the X direction. In other embodiments, cross-bars 1322A and 1322B are not movable relative to the drive shaft and/or supporting arms 1324A-1324D are not movable relative to cross-bars 1322A and 1322B.

FIG. 13C illustrates a configuration 1330 that include two supporting arms 1334A and 1334B, each attached to two contact points, in accordance with certain embodiments. Specifically, contact points 1336A and 1336C are attached to supporting arm 1334A, while contact points 1336B and 1336D are attached to supporting arm 1334B. Supporting arm 1334A is attached to the drive shaft 1337 by a cross-bar 1332A, while supporting arm 1334B is attached to the drive shaft by a cross-bar 1332B. Tilting of cross-bars 1332A and 1332B relative to the drive shaft may be used to move supporting arms 1334A and 1334B and as a result contact points 1336A-1336D in the X direction, e.g., to engage and release article 1331.

FIG. 13D illustrates yet another configuration 1340, in which each supporting arm is directly attached to drive shaft 1347 and supports a separate contact point. Specifically, contact points 1346A is attached to supporting arm 1344A, contact points 1346B is attached to supporting arm 1344B, contact points 1346C is attached to supporting arm 1344C, while contact points 1346D is attached to supporting arm 1344D. Supporting arms 1344A-1344D may tilt relative to the drive shaft in order to move contact points 1346A-1346D in the X direction, e.g., to engage and release article 1341.

Figure 14:
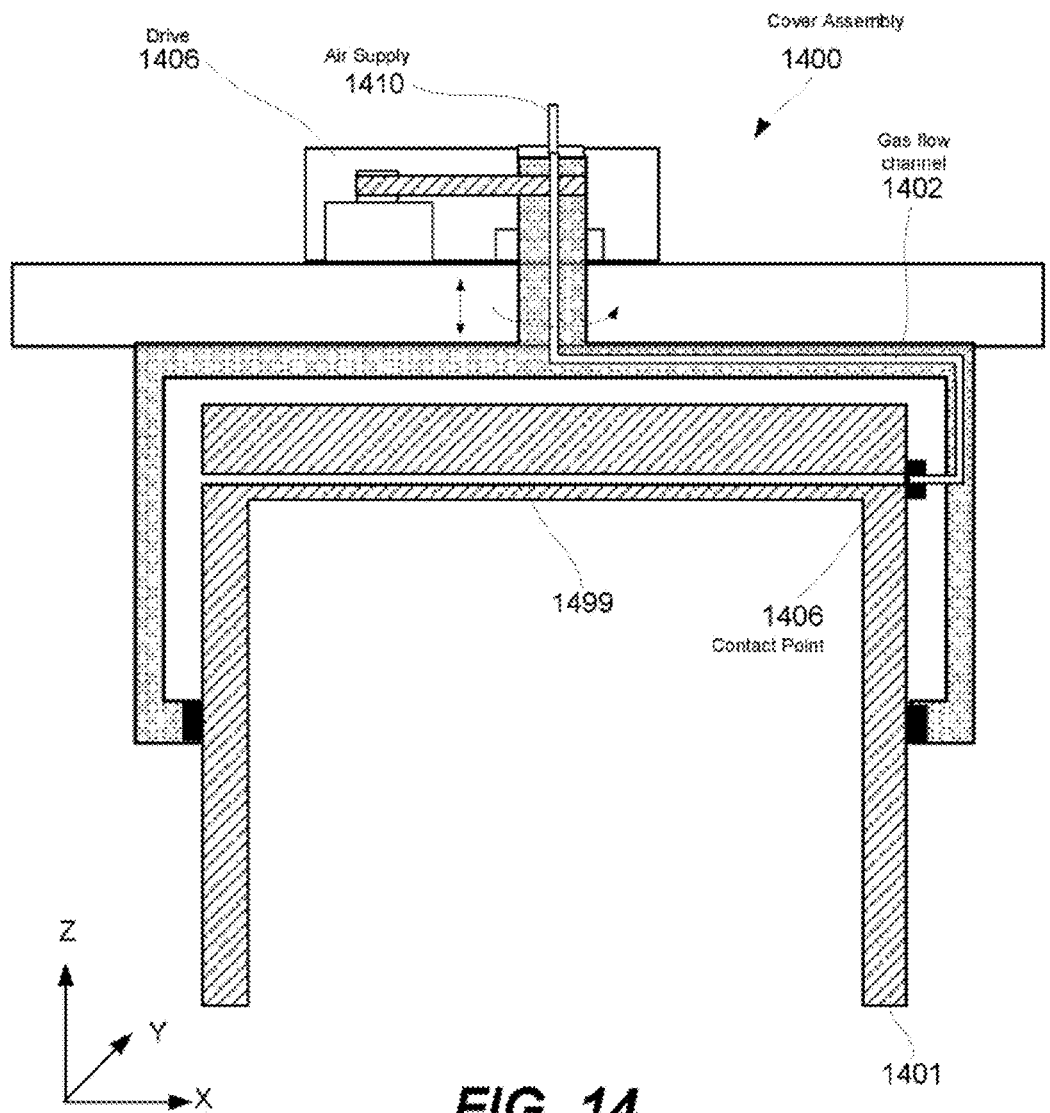
FIG. 14 illustrates a schematic view of an assembly supporting a FOUP body for cleaning according to some embodiments.

FIG. 14 illustrates a schematic view of an assembly supporting a FOUP body for cleaning according to some embodiments. An assembly 1400 may be used for supporting a FOUP body 1401. The configuration of the assembly may change depending on the article being supported. Assembly 1400 may include a cover, a drive mechanism 1406, and multiple supporting arms connected to drive mechanism 1406 using drive shaft. Drive mechanism 1406 may include a motor for rotating drive shaft and slip support (e.g., bearing) for supporting drive shaft relative to non-moving parts. In some embodiments, drive shaft has a gas flow channel 1402 that extends into one or more supporting arms. The gas may be supplied into gas flow channel 1402 from a stationary gas supply line 1410, which may be connected to gas flow channel 1402 using a slip coupling. It should be noted that gas flow channel 1402 is different from channels connected to spraying nozzles. The supporting arm includes a contact point 1406 for engaging with an opening 1499 of the article.

Figure 15:
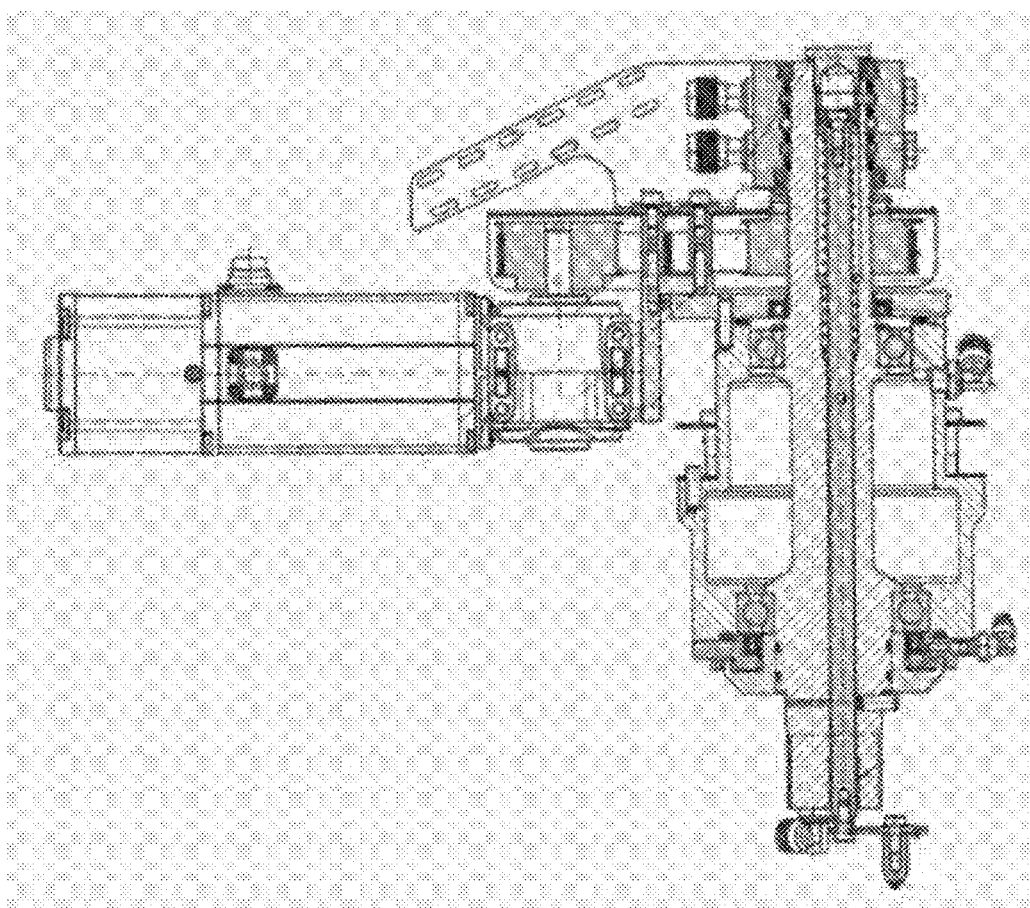
FIG. 15 illustrates a drive mechanism for supporting an article according to some embodiments.

FIG. 15 illustrate a drive mechanism for supporting an article according to some embodiments. The drive mechanism can include a motor for rotating the article, together with a stationary gas inlet for accepting a gas flow from a gas source. A rotating seal, such as a slip ring, can be included to deliver the gas flow to the rotating article, for example, at the openings of the article.

Figure 16:
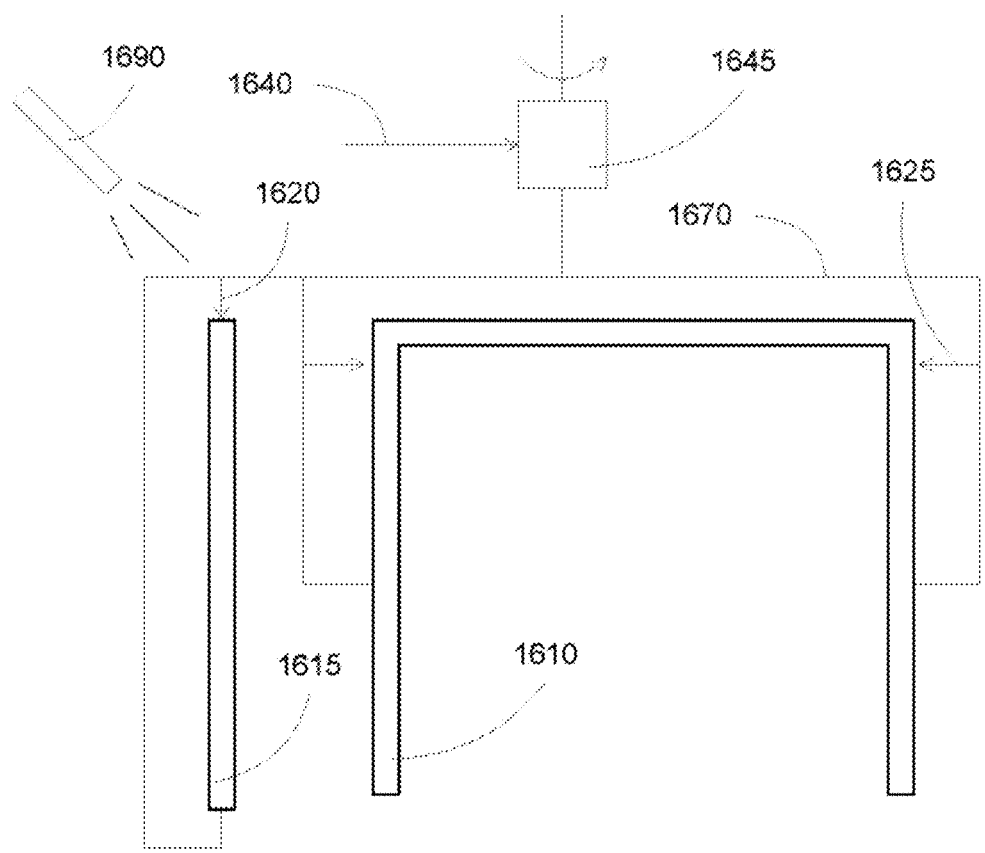
FIG. 16 illustrates another schematic cleaning system according to some embodiments.

FIG. 16 illustrates another schematic cleaning system according to some embodiments. A cleaning system can include support arm 1670 for holding a FOUP body 1610 and a FOUP door 1615 for cleaning. Support arm 1670 can be coupled to a drive mechanism 1645, which can accept a gas source inlet 1640. The FOUP body 1610 and door 1615 can be movable with respect to spaying nozzles 1690. Gas nozzles or contact points 1620 and 1625 can be coupled to the FOUP door 1615 and body 1610 for protecting openings in the FOUP door 1615 and body 1610.

Figure 17A:
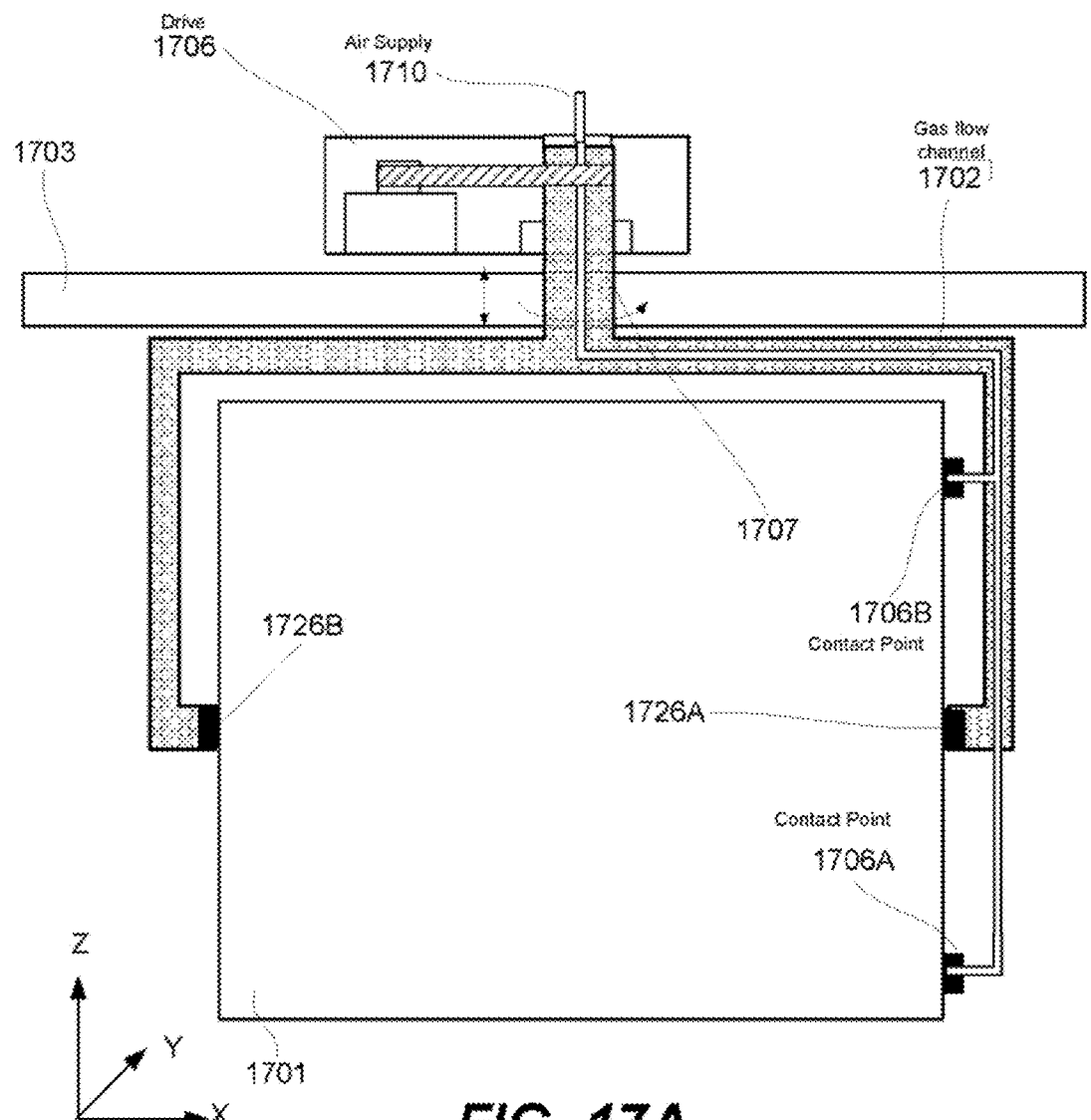
FIGS. 17A-17B illustrate schematic views of another assembly supporting a FOUP door for cleaning according to some embodiments.
Figure 17B:
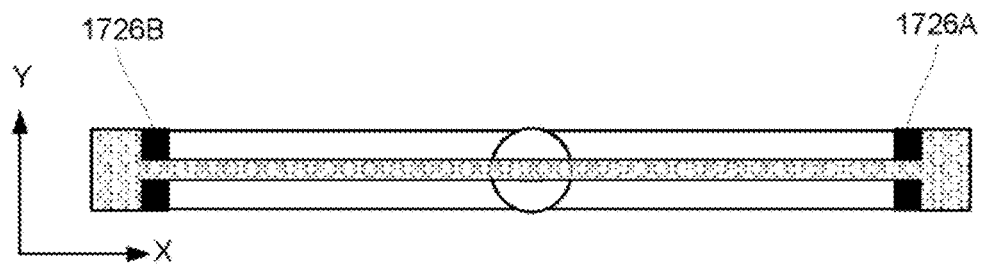

FIGS. 17A-17B illustrate schematic views of another assembly supporting a FOUP door for cleaning according to some embodiments. FIG. 17A shows a schematic side view and FIG. 17B shows a schematic top view of an assembly for cleaning a FOUP door 1701.

The assembly may include a cover 1703, a drive mechanism 1706, and multiple supporting arms connected to drive mechanism 1706 using a drive shaft. Drive shaft 1707 has a gas flow channel 1702 that extends into one or more supporting arms supporting the FOUP door. The gas may be supplied into gas flow channel 1702 from a stationary gas supply line 1710, which may be connected to gas flow channel 1702 using a slip coupling.

The supporting arm includes support points 1726A and 1726B for engaging with an article. The support arm can include contact points 1706A and 1706B for protecting openings in the FOUP door.

Figure 18:
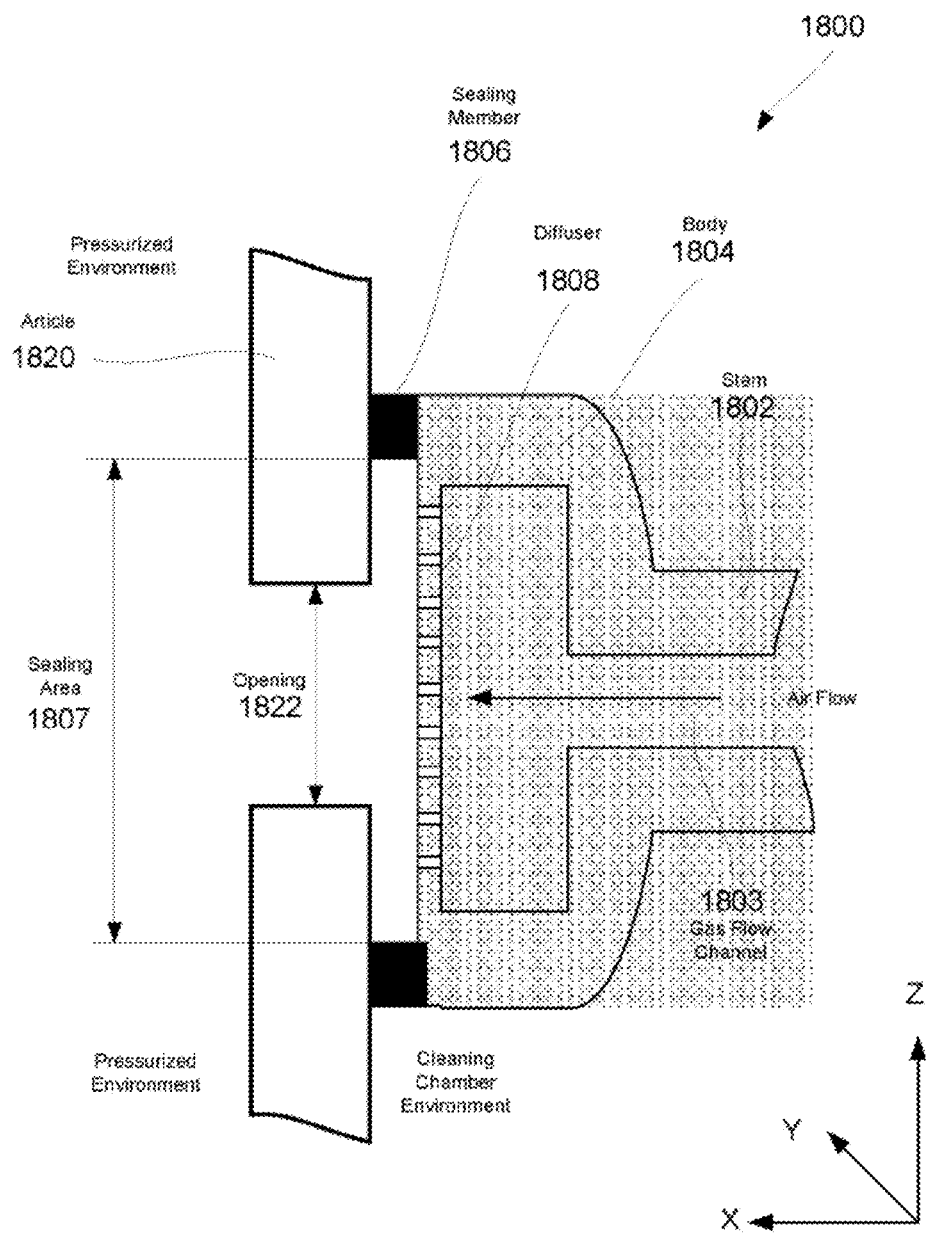

FIGS. 18 and 19A-19C illustrate various contact points for engaging an article during a cleaning process according to some embodiments. FIG. 18 is a schematic cross-sectional view of a contact point 1800 engaging an article 1820 during cleaning and drying of article 1820, in accordance with some embodiments. Contact point 1800 includes a stem 1802 that is attached to a supporting arm (not shown) and a body 1804. Body 1804 may be expanded in the Y-Z plane relative to stem 1802 to provide a larger footprint and be able to cover larger openings. At the same time, the smaller profile of stem 1802 in the Y-Z plane minimizes interferences within the cleaning chamber.

Body 1804 may include a sealing member 1806 that actually comes in contact with article 1820. Sealing member 1806 defines a sealing area 1807, which is typically larger opening 1822 in article 1820. In some embodiments, the largest dimension (e.g., a diagonal of a rectangle or a large diameter of an oval) of sealing area 1807 is at least about 1.5 times greater than the corresponding largest dimension if opening 1822. In some embodiments, this ratio is at least about 2 and even at least about 4. Large sealing areas simplify alignment process while ensuring the seal. At the same time, portions of articles covered by these larger seals are not cleaned.

Sealing member 1806 may be made from a suitable soft polymer that may compress when contact point is engaged. Some examples of such materials include butyl, EPDM, neoprene, nitrile, SBR, silicone, vinyl, and VITON™. In some embodiments, sealing member 1806 should provide sufficient friction when engage with article 1820 so that article 1820 does not slide out. At the same time, materials used for sealing member 1806 should not generate particles and serve as contamination sources.

As noted above, some if not all contact points may be gas supplying contact points. FIG. 18 illustrates an example of a gas supplying contact point 1800. Stem 1802 may include a gas flow channel 1803 for delivering gas into body 1804. Body 1804 may have a diffuser plate 1808 for uniform distribution of this gas into opening 1822 of the article. The uniform distribution may prevent additional contamination. This gas flow may create a pressurize environment within opening 1822 and inside article 1820 in comparison to the cleaning chamber environment. In some embodiments, the difference in pressure is between about 1 kPa to 100 kPa. This difference in pressure may help to prevent from liquid getting into sealing area 1807 when, e.g., a seal is not complete.

A contact point that is not a gas supplying contact point may also include a stem, body, and a sealing member as described above. However, the non-gas supplying contact point may not have a gas flow channel or a diffuser plate. The gas supplying contact points may be used in combination with non-gas supplying contact points when, for example, an article may allow for a gas to flow from one opening to another through internal cavities of the article. In some embodiments, a contact point includes an alignment device (not shown) for aligning the sealing member with the opening.

Some contact points may be actuated pneumatically. FIGS. 19A-19C show schematic cross-sectional views of a contact point 1900 movable relative to its supporting arm 1910 by a supply of gas, in accordance with some embodiments. In fact, the gas used to actuate contact point 1900 may be also used to pressurize opening 1922 in article 1920 that is being engage by contact point 1900.

Contact point 1900 may include a stem 1902, a body 1904, and a spring 1906. Stem 1902 can slip within body 1904 in the X direction. Furthermore, stem 1902 can slip within supporting arm 1910. The position of stem 1902 relative to body 1904 and supporting arm 1910 is determined by the force balance exerted by spring 1906 and pressure of the supplied gas. For example, spring 1906 controls extension of stem 1902 into cavity 1905 of body 1904. When the pressure inside stem 1902 is low, spring 1906 pushes stem 1902 out of cavity 1905 in the direction opposite of the X direction. As the pressure inside stem 1902 increases, the force caused by this pressure overcomes the force of spring 1906 and stem 1902 starts extending into cavity 1905. Stem 1902 may include gas release aperture 1908, which allows the gas to escape from stem 1902 when aperture 1908 extends into cavity 1905 as, e.g., shown in FIG. 19C. On the other hand, when stem 1902 is retracted and gas release aperture 1908 is blocked by body 1904, then the gas cannot escape from stem 1902. Different positions of stem 1902 and operations of contact point will now be described in more details.

The position illustrated in FIG. 19A may be referred to as a retracted position. In this position, stop 1903 of stem 1902 is in contact with supporting arm 1910, while stem 1902 is retracted into body 1904 such that gas release aperture 1908 is blocked by body 1904. The gas pressure inside stem 1902 may be the lowest in this position. In fact, the pressure inside stem 1902 may be reduced below the pressure outside of stem 1902 in order, e.g., to retract stem 1902 into support arm 1910.

As the pressure builds up inside stem 1902, stem 1902 can be slightly pushed out of supporting arm 1910 until body 1904 engages article 1920. Article 1920 effectively acts as a positive stop for body 1904. The force with which body 1904 engages article 1920 depends on pressure inside stem 1902 (relative to the pressure outside of stem 1902) and the cross-sectional area of stem in the Y-Z plane. This position of contact point 1900 may be referred to as a partially extended position and is illustrated in FIG. 19B. In this position, the gas from the stem may not be supplied into cavity 1905 since gas release aperture 1908 is still blocked by body 1904. The pressure inside stem 1902 at this stage is still not sufficient to overcome the force of spring 1906 and stem 1902 does not extend sufficiently into cavity 1905 for gas to escape.

The process may continue with building up the pressure inside stem 1902, and, at some point, stem 1902 extends into cavity far enough that the gas can escape from gas release aperture 1908 and into cavity 1905. The pressure of the gas inside stem 1902 should be enough to overcome the force of spring 1906 and spring is compressed during this part of the process. This position is illustrate in FIG. 19C and may be referred to as a fully extended position. In this position, gas release aperture 1908 is not blocked by body 1904, which allows the gas to escape from stem 1902 and into cavity 1905. As such, the gas that is used to actuate contact point 1900 is also used to pressurize opening 1922 within article 1920.

Depending on the size of gas release aperture 1908 and the gas flow, contact point 1900 may stay in a fully extended position while the gas is being supplied. In some embodiments, gas release aperture 1908 may be partially blocked by body 1904 such that the gas only escapes through a portion of gas release aperture 1908. This position may be referred to as an equilibrium position in which compression of spring 1906 (corresponding to partial blocking of gas release aperture 1908) is balanced by the pressure within stem 1902. Any change in the gas flow may move stem 1902 into a new equilibrium position, i.e., corresponding to more opened gas release aperture 1908 when the flow is increased and less opened gas release aperture 1908 when the flow is decreased. As such, the engagement force and pressurization inside opening 1922 may be controlled by the gas flow through stem 1902 and support arm 1910. It should be noted that the equilibrium position may be also influenced by the pressurization within the opening that may try to push stem 1902 back into body.

The process of going back from the fully extended position to the partially extended position and eventually into the retracted position is completed by reducing the gas flow and/or pressure through supporting arm 1910 and stem 1902. When the pressure inside stem 1902 cannot overcome the force exerted by compressed spring 1906, spring 1906 expands (as illustrated by transition from FIG. 19C to FIG. 19B) and pulls stem 1902 from cavity 1905. In order to retract stem 1902 into supporting arm (as illustrated by transition from FIG. 19B to FIG. 19A), the pressure inside stem 1902 may be further reduced such that the entire contact point 1900 is shift away from article 1920.

FIGS. 20A-20D illustrate schematic configurations for cleaning nozzles according to some embodiments. When an object is rotated around an axis, it outer most point (i.e., the most distant point from the axis) defines a circular rotational boundary. This boundary only coincides with outer surfaces of round cylindrical objects that are rotated around their center axis. All other types of objects and/or off-axis rotation have boundaries that extend away from the outer surfaces of these objects. As such, positioning spraying nozzles outside of the circular rotational boundary may cause in insufficient cleaning of some parts of an article as illustrated in FIGS. 20A-20B. Specifically, FIGS. 20A-20B illustrate FOUP door 2002 rotated around its own center 2004 such that corners 2008 define circular rotational boundary 2006. Spraying nozzle 2010 is positioned outside of this boundary 2006. When a corner 2008 of FOUP door 2002 faces spraying nozzle 2010 as shown in FIG. 20A, the distance between corner 2008 and spraying nozzle 2010 is small. However, when FOUP door 2002 turns and side 2009 of FOUP door 2002 faces spraying nozzle 2010, the distance between side 2009 and spraying nozzle 2010 is significantly larger. As such, side 2009 may be cleaned less effectively in comparison to corner 2008.

Stationary objects cannot be positioned within rotational boundary as these objected will be crashed into by a rotating article. However, an object may be moved in and out of the rotational boundary during rotation of an article without crashing one into another. Returning to the above described examples, when corner 2008 passes spraying nozzle 2010, nozzle 2010 may start moving towards boundary 2006 and even into boundary 2006 as, e.g., shown in FIG. 20C. The motion of nozzle 2010 is synchronized with the rotation of FOUP door 2002. The amount of travel may depend on the shape of an article that is being rotated. In some embodiments, the distance between spraying nozzle 2010 and a point on FOUP door 2002 to which spraying nozzle is directed remains substantially the same during rotation of FOUP door 2002. As such spraying nozzle 2010 may move with variable speed if FOUP door 2002 is rotated with a constant speed and vice versa.

Once spraying nozzle 2010 is protruded into boundary 2006, it needs to be retracted from the boundary at least once during rotation of an article. In some embodiments, spraying nozzle 2010 may be retracted from and inserted back into boundary multiple times during one rotation. For example, FOUP door 2002 has four corners and spraying nozzle 2010 has to be retracted from boundary every time a new corners passes spraying nozzle 2010 (assuming rotation around the center of FOUP door 2002). FIG. 20D illustrates retracted spraying nozzle 2010 as corner 2012 passes nozzle 2010. Spraying nozzle 2010 may be then extended into boundary 2006 after corner 2012 is past nozzle 2010 as so on.

In some embodiments, a rotated article may be surrounded by multiple spraying nozzles surrounding the article. One or more of these nozzles is configured to move in and our relative to the rotational axis. In some embodiments, all nozzles are movable relative to the rotational axis. Nozzles may also move in other directions, e.g., parallel to the rotational axis. In some embodiments, spraying nozzles may turn relative to their attachment points.

FIG. 21 illustrates a flow chart for cleaning an article according to some embodiments. Operation 2100 loads a body and a lid of a container to a cleaning chamber. Operation 2120 aligns a gas nozzle to a portion of the lid and/or the body. The gas nozzle can be disposed in a vicinity of the portion. The gas nozzle can totally or partially blocks the portion of the lid and/or the body. Operation 2130 flows a gas to the gas nozzle. Operation 2140 flows a liquid toward the body and lid for cleaning. Operation 2150 rotates the body and lid during cleaning.

Figure 22:
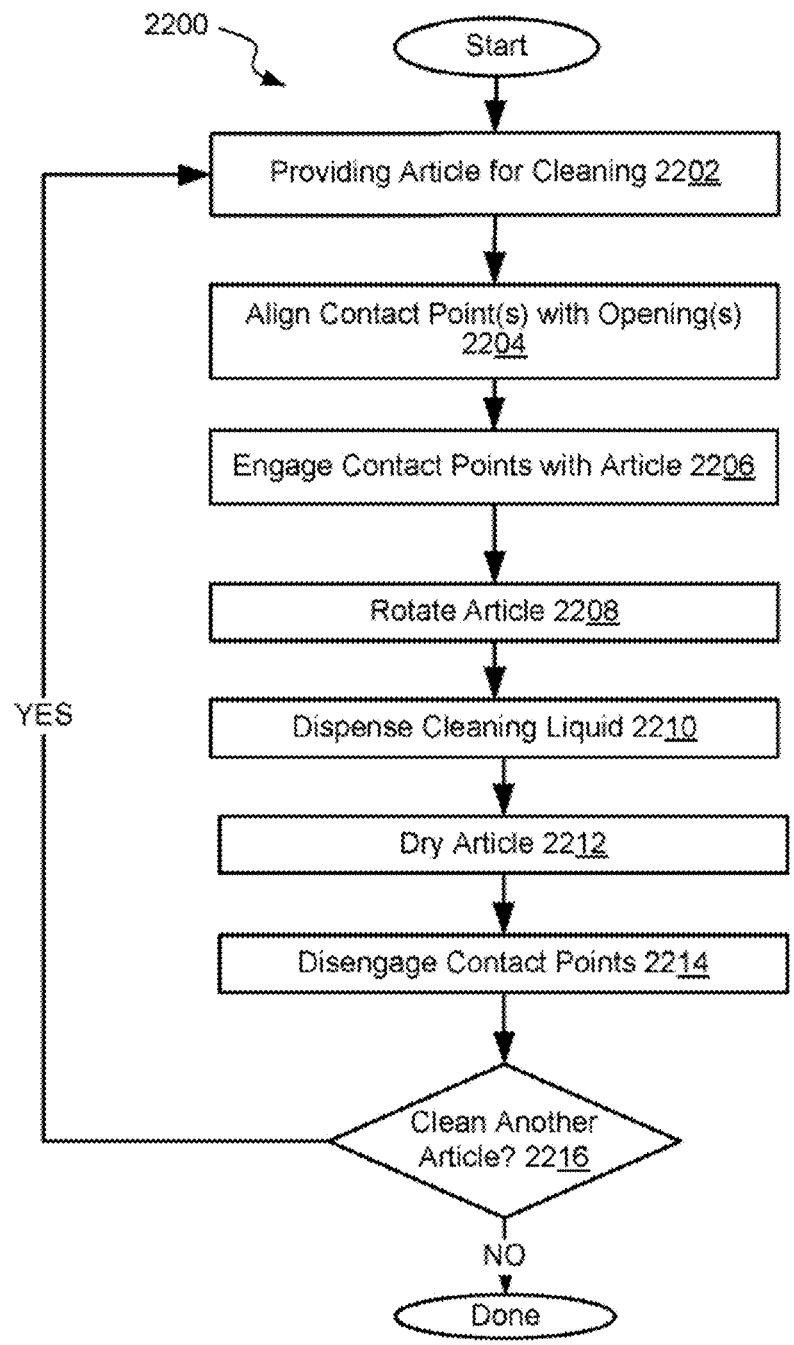
FIG. 22 illustrates another flow chart for cleaning an article according to some embodiments.

FIG. 22 illustrates another flow chart for cleaning an article according to some embodiments. For example, the cleaning system may be used for cleaning FOUP doors. Method 2200 may commence with providing the article into the cleaning system during operation 2202. Various examples of articles and cleaning systems are described above. The article may be separated from other articles being cleaned in the same chamber. For example, a FOUP cover may be separated from a FOUP shell. The article may be provided or, more specifically, positioned within the cleaning system using a transfer system. The cleaning system may be in an open state. For example, a cover may be raised relative to the cleaning chamber such that the transfer system has access to supporting arms and other components of the system. The articles may be supported by the transfer system up until operation 2206 during which the contact points engage with the article.

Method 2200 may proceed with align at least one contact point with at least one opening on the article during operation 2204. In some embodiments, each contact point is aligned with a separate opening. Furthermore, one contact point may be used to cover multiple openings in the article. Operation 2204 may involve moving contact points with respect to each other and/or with respect to an article.

Method 2200 may proceed with engaging contact points with article during operation 2206. As described above, this operation may involve moving contact points relative to supporting arms and/or moving the supporting arms relative to the drive shaft. After operation 2206, the article is supported by the contact points and external handling systems may be retrieved from the cleaning system.

Method 2200 then continues with rotating the article relative to the set of spraying nozzles during operation 2208. In some embodiment, the set of spraying nozzles are stationary, while the article is movable. In other embodiments, the article is stationary, while the spraying nozzles are movable. Furthermore, both the article and the spraying nozzles may be movable.

At some point after engaging the contact points, dispensing of the cleaning liquid may be initiation as reflected by operation 2210. The dispensing of the liquid may start prior or after stating the rotation of the article. Overall, operations 2208 and 2210 proceeds in parallel for a period of time. Operation 2210 also involved supplying a gas into the opening in the article thereby pressurizing these and, in some embodiments, other openings. Pressurization helps to prevent liquid getting into openings. Operation 2210 may also involve dispensing of the rinsing liquid. The rinsing liquid may be dispensed in a manner similar to the cleaning liquid.

After dispensing of cleaning and/or cleaning liquid is completed, method 2200 may proceed with drying the article during operation 2212. The article may still rotate during this operation. In fact, operation 2212 may involve spin drying such that the article is rotated at a faster speed than, e.g., during previous operations. In some embodiments, operation 2212 involves flowing drying gases into the cleaning chamber. The drying gases may be flow through the spraying nozzles used for the cleaning liquid.

Once the article is sufficiently dried, the contact points may be disengaged from the article during operation 2214. Supply of the gas into the article may also be discontinued at this point as there is low risk of any liquids getting into the article. As such, the openings of the article are effectively sealed through the entire wet portion of the cleaning process.

At this point, the article may be supported by an external handling mechanism that may extend into the cleaning chamber. Operations 2202-2212 may be repeated for another article as reflected by the decision bock 2216.

Figure 23:
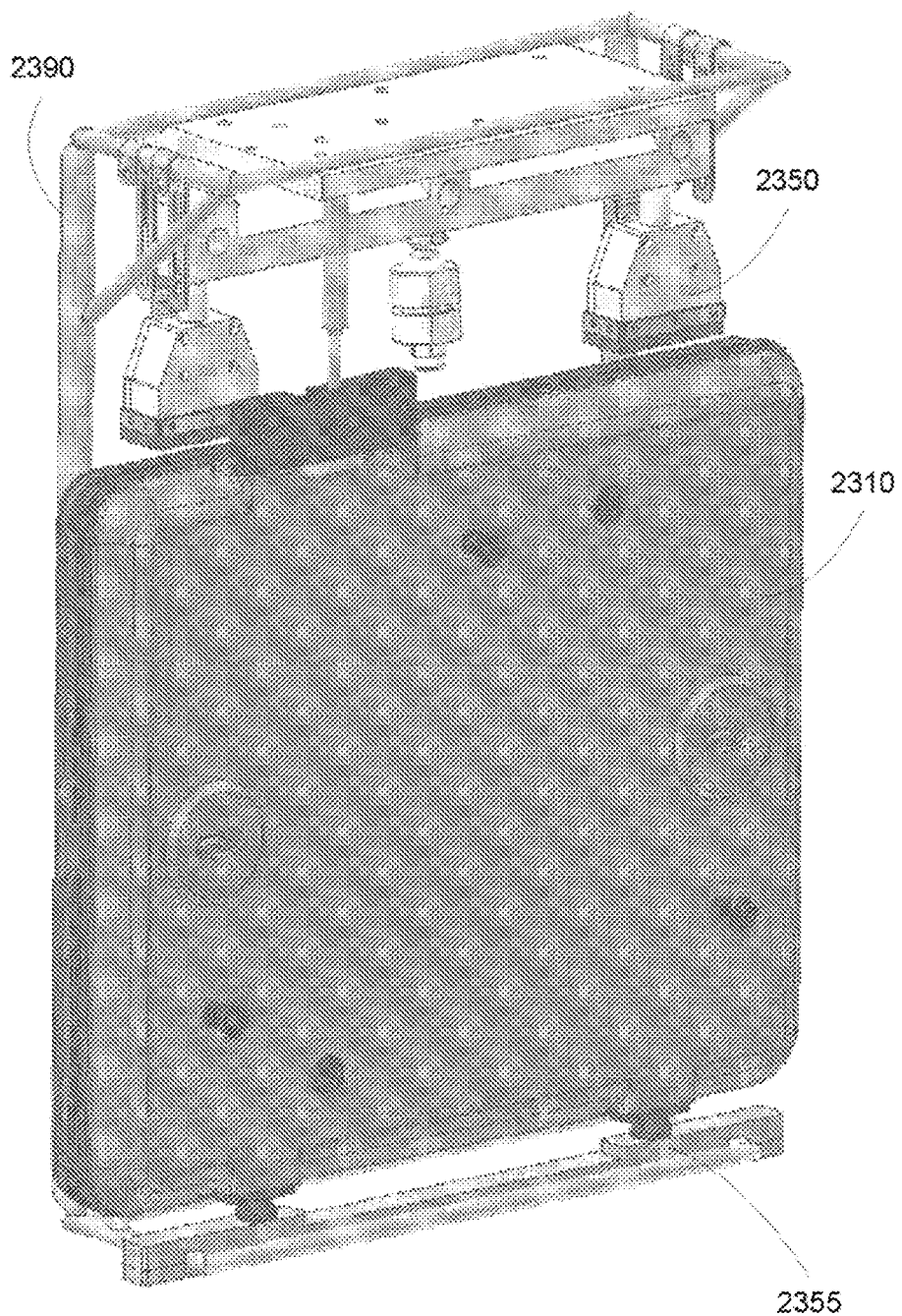
FIG. 23 illustrates an example of FOUP door support before cleaning according to some embodiments.

FIG. 23 illustrates an example of FOUP door support before cleaning according to some embodiments. A FOUP door 2310 can be mounted to a support frame 2390, which can be placed in a cleaning chamber. Contact points 2350 can be placed in a vicinity of the openings of the FOUP door, for example, at the latch plate of the latch mechanism. The contact points 2350 can protect the openings from having liquid trapped and retained in the openings, and thus can simplify the drying process. Opposite elements 2355 can be used for supporting the FOUP door or for protecting the opposite latch plates. For example, the opposite elements can be contact points similar to the contact points 2350. The opposite elements can be a support point, or a different kind of contact points.

Figure 24:
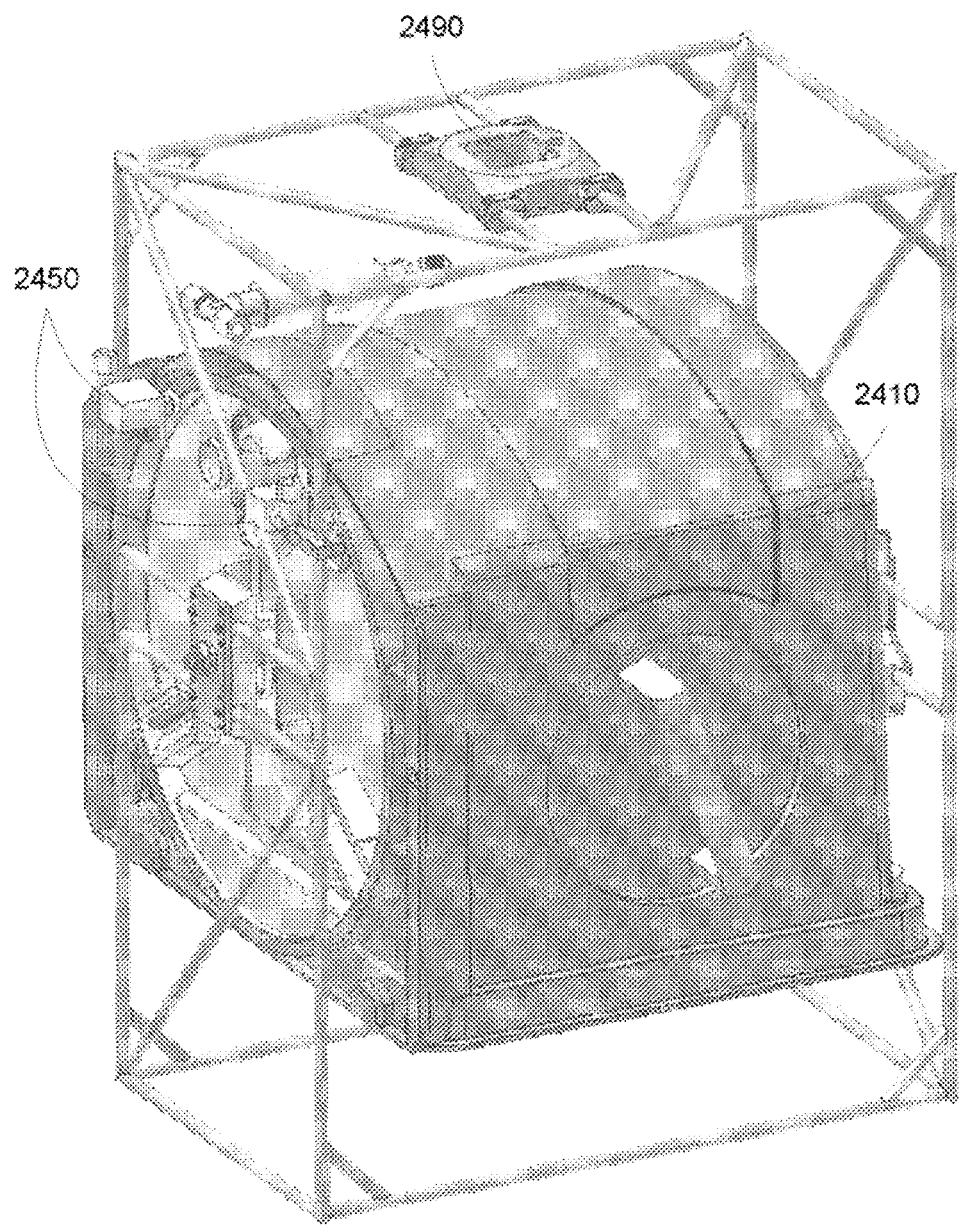
FIG. 24 illustrates an example of FOUP body support before cleaning according to some embodiments.

FIG. 24 illustrates an example of FOUP body support before cleaning according to some embodiments. A body 2410 can be mounted to a support frame 2490, which can be placed in a cleaning chamber. Contact points 2450 can be placed in a vicinity of the openings of the FOUP body, for example, at the through holes at the corners of the FOUP body. The contact points 2450 can protect the openings from having liquid trapped and retained in the openings, and thus can simplify the drying process.

In some embodiments, the present invention discloses a system for cleaning semiconductor substrate storage containers. The system can include a cleaning chamber. The system can also include multiple supporting arms positioned within the cleaning chamber. The system can also include multiple contact points for engaging an article and for supporting an article during cleaning of the article. The article can be a front opening unified pod (FOUP) door. At least one of the multiple contact points can be attached to a support arm. The multiple contact points can include a gas supplying contact point. At least one contact point is configured to move relative to the article for engaging the article. At least one contact point is attached to a movable supporting arm. The movable supporting arm can be movable relative to the article for engaging the article with the at least one contact point. At least one contact point is attached to a stationary supporting arm. The at least one contact point can be movable relative to the stationary supporting arm for engaging the article with the at least one contact point. The at least one contact point can be the gas supplying contact point. At least two contact points are configured to move relative to the article for engaging the article. The contact point can include a seal for engaging the article. The contact point can be gas supplying contact point. The gas supplying contact point can be configured to align with an opening in the article. The gas supplying contact point can include an gas flow channel for supplying a gas to the opening in the article. The gas supplying contact point can be driven by the gas supplied through the gas flow channel. The gas flow channel can extend through a supporting arm attached to the gas supplying contact point. The gas flow channel can extend through a drive shaft, wherein the drive mechanism comprises a slip coupling for connecting the gas flow channel in the drive shaft to an external gas supply.

The system can also include a drive mechanism, which can include a drive shaft attached to the multiple supporting arms, The drive mechanism can be configured to rotate the multiple supporting arms within the cleaning chamber. The drive mechanism can be configured to rotate the multiple supporting arms at a rotational speed of between about 5 RPM and 25 RPM.

The system can also include a set of spraying nozzles for dispensing a cleaning liquid onto the article. At least one spraying nozzle in the set of spraying nozzles can be configured to move in and out relative to the drive shaft. The movement of the at least one spraying nozzle can be synchronized with the rotation of the multiple supporting arms within the cleaning chamber. The movement of the at least one spraying nozzle can be configured to maintain a substantially constant distance of the at least one spraying nozzles and the article.

The system can also include a cover for positioning over and closing the cleaning chamber during cleaning of the article. The cover can support the drive mechanism and the multiple supporting arms.

The system can also include a support for a FOUP body for cleaning together with the FOUP door. The support for the FOUP body can be attached to the multiple supporting arms.

The system can also include a system controller, which can include a set of instructions for align at least the gas supplying contact point with the openings in the article; engaging each contact point with the article; rotating the article relative to the set of spraying nozzles; and dispensing the cleaning liquid from the set of spraying nozzles while supplying the gas into the opening of the article.

In some embodiments, the present invention discloses a system for cleaning semiconductor containers. The system can include a cleaning chamber, a support structure, a contact point, and a set of spraying nozzles. The support structure is configured to support a container door, wherein the support structure is configured to be positioned within the cleaning chamber. The contact point can be configured for protecting a latch opening of the container door. The contact point can be configured to engage with the latch opening. The contact point can include a gas channel configured to flow a gas to the latch opening. The set of spraying nozzles can be configured for dispensing a cleaning liquid onto the container door.

The support structure can be configured to support a container body. The system can include a second contact point for protecting an opening of the container body. The second contact point can be configured to engage with the opening of the container body. The second contact point can include a second gas channel configured to flow a gas to the opening of the container body. The system can include a set of second spraying nozzles for dispensing a cleaning liquid onto the container body.

The gas flow channel can extend through a drive shaft. The drive mechanism can include a slip coupling for connecting the gas flow channel in the drive shaft to an external gas supply. The contact point can be coupled to the support structure. The contact point can include a gas inlet for accepting a gas to the gas channel.

The system can include a drive mechanism comprising a drive shaft attached to the support structure. The drive mechanism can be configured to rotate the support structure within the cleaning chamber. The drive mechanism can be configured to rotate the support structure at a rotational speed of between about 5 RPM and 25 RPM. At least one spraying nozzle in the set of spraying nozzles is configured to move in and out relative to the drive shaft. The movement of the at least one spraying nozzle can be synchronized with the rotation of the multiple supporting arms within the cleaning chamber. The movement of the at least one spraying nozzle can be configured to maintain a substantially constant distance of the at least one spraying nozzles and the article.

The system can include a gas conduct. The gas conduit can be coupled to a gas source at the drive mechanism. The gas conduit can be couple to the gas inlet of the contact point. The system can include a cover for positioning over and closing the cleaning chamber during cleaning of the article. The cover can support the drive mechanism and the support structure. The contact point can be configured to move relative to the container door for engaging the container door. The contact point can be attached to a supporting arm, wherein the movable supporting arm is movable relative to the contact point for engaging the contact point with the container door. The contact point can include a seal for engaging the article.

In some embodiments, the present invention discloses a method for cleaning semiconductor substrate storage containers having an opening. The cleaning system can include multiple supporting arms, multiple contact points, and a set of spraying nozzles. At least one of the multiple contact points being attached to each of the multiple support arms. The contact points can include comprise a gas supplying contact point. The gas supplying contact point can include an gas flow channel for supplying a gas to the opening in the article.

The method can include providing an article into a cleaning system; align the gas supplying contact point with the opening of the article; engaging each contact point with the article; rotating the article relative to the set of spraying nozzles; and dispensing the cleaning liquid from the set of spraying nozzles while supplying a gas into the opening in the article.

In some embodiments, the present invention discloses a method for cleaning an article. The method can include protecting an opening of the article with a gas flow; and cleaning the article with a liquid. The method can further include rotating the article. The method can further include loading the article in a cleaning chamber, and aligning the gas flow with the opening. The method can further include align the contact point with the opening of the article; and engaging the contact point with the article.

The opening can include a cavity. The cavity can have an aperture at a surface of the article. A dimension of the aperture can be smaller than a dimension of the cavity. The opening can include an object. The object can be configured to be slidable in the opening. The object can be positioned in the opening with a gap, wherein the length of the object is at least 10×, 20×, or 50× greater than the gap. The opening can include a hole. The hole can have an aperture at a surface of the article. The hole can have a depth. The ratio of the depth and a dimension of the aperture can be higher than 10:1, 20:1, or higher than 50:1.

Protecting the opening can include supplying the gas flow into the opening. Protecting the opening can include applying the gas flow toward the opening to minimizing liquid entering the opening. Protecting the opening can include blocking the opening from being exposed to the liquid. Protecting the opening can include pressurizing the opening with the gas flow. Protecting the opening can include applying a contact point at the opening, and applying the gas flow to the contact point.

Cleaning the article can include flowing a liquid toward the article. Cleaning the article can include submerging the article in a liquid.

In some embodiments, the present invention discloses a method for cleaning a semiconductor container. The method can include loading a container door to a cleaning chamber; protecting a latch opening of the container door with a contact point; and flowing a liquid toward the container door while supplying a gas flow into the gas inlet of the contact point. The contact point can be configured to channel a gas from a gas inlet to the latch opening. The method can further include rotating the container door, aligning and engaging the contact point with the opening, and/or draining the liquid from the cleaning chamber.

Cleaning the container body can include flowing a liquid toward the container body while protecting an opening of the container body with a gas flow. The latch opening can include a latch element. The latch element can be configured to be slidable in the latch opening. The latch element can be positioned in the opening with a gap. The length of the latch element can be at least 10×, 20×, or 50× greater than the gap.

Protecting the latch opening can include sealing the latch opening with the contact point. Protecting the latch opening can include applying the contact point near the latch opening without touching the container door. Protecting the latch opening can include pressurizing the contact point with the gas flow.

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method for cleaning an article, the method comprising:
   protecting an opening in an exterior surface of the article with a gas flow from a nozzle;
   supplying the gas flow from the nozzle which is spaced apart from the exterior surface such that a gap exists between the nozzle and the exterior surface, so that the gas flow from the nozzle impinges the opening in the exterior surface; and
   cleaning the article with a liquid while the gas flow, impinging the opening, substantially prevents the liquid from entering the opening.

2. The method of claim 1, further comprising aligning the gas flow with the opening.

3. The method of claim 1, wherein the opening comprises an object, wherein
   the object is configured to be slidable in the opening, or
   the object is positioned in the opening with a gap, wherein the length of the object is at least 10× greater than the gap.

4. The method of claim 1, wherein the opening comprises
   a cavity, wherein the cavity has an aperture at a surface of the article, wherein a dimension of the aperture is smaller than a dimension of the cavity, or
   a hole, wherein the hole has an aperture at a surface of the article, wherein the hole has a depth, wherein the ratio of the depth and a dimension of the aperture is higher than 20:1.

5. The method of claim 1, wherein protecting the opening comprises one of
   supplying the gas flow into the opening,
   applying the gas flow toward the opening to minimize liquid entering the opening,
   blocking the opening from being exposed to the liquid,
   pressurizing the opening with the gas flow, or
   applying a contact point at the opening, and applying the gas flow to the contact point.

6. The method claim 1, wherein cleaning the article comprises
   flowing a liquid toward the article, or
   submerging the article in a liquid.

* * * * *